US011514644B2

(12) United States Patent
Moreno et al.

(10) Patent No.: US 11,514,644 B2
(45) Date of Patent: Nov. 29, 2022

(54) AUTOMATED ROOF SURFACE MEASUREMENT FROM COMBINED AERIAL LIDAR DATA AND IMAGERY

(71) Applicant: SOFDESK INC., Montréal (CA)

(72) Inventors: Lennie Moreno, Montréal (CA); Maxime Fafard, Blainville (CA); Elise Epaillard, Verdun (CA); Jason Wiener, Montréal (CA); Walid Masoudimansour, Montréal (CA); Jean-Daniel Bussières, Québec (CA); Benoît Debaque, Québec (CA); Jaden Travnik, Montréal (CA)

(73) Assignee: Enphase Energy, Inc., Fremont, CA (US)

( * ) Notice: Subject to any disclaimer, the term of this patent is extended or adjusted under 35 U.S.C. 154(b) by 987 days.

(21) Appl. No.: 16/251,911

(22) Filed: Jan. 18, 2019

(65) Prior Publication Data

US 2019/0279420 A1   Sep. 12, 2019

Related U.S. Application Data

(60) Provisional application No. 62/701,093, filed on Jul. 20, 2018, provisional application No. 62/619,385, filed on Jan. 19, 2018.

(51) Int. Cl.
*G06T 17/05* (2011.01)
*G01C 15/00* (2006.01)
(Continued)

(52) U.S. Cl.
CPC ............ *G06T 17/05* (2013.01); *G01C 15/002* (2013.01); *G06F 30/13* (2020.01); *G06T 17/10* (2013.01);
(Continued)

(58) Field of Classification Search
CPC ................ G06T 17/05; G06T 17/10; G06T 2207/10032; G06T 2207/30184;
(Continued)

(56) References Cited

U.S. PATENT DOCUMENTS 7,509,241 B2   3/2009   Guo et al.
8,078,436 B2   12/2011  Pershing et al.
(Continued)

FOREIGN PATENT DOCUMENTS

EP          2758941 A1    1/2016
WO    2013/044129 A1    3/2013
(Continued)

OTHER PUBLICATIONS

Sun et al., "Complex Building Roof Detection and Strict Description From Lidar Data and Orthorectified Aerial Imagery", 2012 IEEE International Geoscience and Remote Sensing Symposium (Year: 2012).*
(Continued)

*Primary Examiner* — Rehana Perveen
*Assistant Examiner* — Troy A Maust
(74) *Attorney, Agent, or Firm* — Lewis Rice LLC

(57) ABSTRACT

Systems and methods for automatically generating a 3D model of a roof of a building are provided. In a described embodiment, the method includes receiving point cloud data comprising a plurality of data points corresponding to height measurements at a given location; processing the point cloud data to identify roof surfaces; generating a 3D model of the roof using the identified surfaces; receiving aerial imagery of the roof; registering the aerial imagery with the point cloud data; and refining the 3D model using the aerial imagery. A corresponding computing system and non-transitory computer readable medium for carrying out the methods are also provided.

19 Claims, 19 Drawing Sheets

(51) Int. Cl.
*G06T 17/10* (2006.01)
*G06F 30/13* (2020.01)
*G01S 17/89* (2020.01)

(52) U.S. Cl.
CPC ..... *G01S 17/89* (2013.01); *G06T 2207/10032* (2013.01); *G06T 2207/30184* (2013.01)

(58) Field of Classification Search
CPC ............. G06T 7/33; G06T 2207/10028; G06T 2210/56; G01C 15/002; G06F 30/13; G01S 17/89; G06V 2201/12; G06V 20/176; G06V 20/64
See application file for complete search history.

(56) References Cited

U.S. PATENT DOCUMENTS

| | | |
|---|---|---|
| 8,145,578 B2 | 3/2012 | Pershing et al. |
| 8,170,840 B2 | 5/2012 | Pershing |
| 8,209,152 B2 | 6/2012 | Pershing |
| 8,275,194 B2 | 9/2012 | Zebedin |
| 8,401,222 B2 | 3/2013 | Thornberry et al. |
| 8,422,825 B1 | 4/2013 | Neophytou et al. |
| 8,515,125 B2 | 8/2013 | Thornberry et al. |
| 8,531,472 B2 | 9/2013 | Freund et al. |
| 8,542,880 B2 | 9/2013 | Thornberry et al. |
| 8,648,872 B2 | 2/2014 | Freund |
| 8,670,961 B2 | 3/2014 | Pershing et al. |
| 8,718,393 B2 | 5/2014 | Chen et al. |
| 8,731,234 B1 | 5/2014 | Ciarcia et al. |
| 8,818,770 B2 | 8/2014 | Pershing |
| 8,852,454 B2 | 9/2014 | Pershing |
| 8,938,090 B2 | 1/2015 | Thornberry et al. |
| 8,970,615 B2 | 3/2015 | Freund et al. |
| 9,129,376 B2 | 9/2015 | Pershing |
| 9,135,507 B2 | 9/2015 | Chen et al. |
| 9,135,737 B2 | 9/2015 | Pershing |
| 9,147,287 B2 | 9/2015 | Ciarcia |
| 9,159,164 B2 | 10/2015 | Ciarcia |
| 9,244,589 B2 | 1/2016 | Thornberry et al. |
| 9,275,496 B2 | 3/2016 | Freund |
| 9,292,913 B2 | 3/2016 | Schultz et al. |
| 9,323,749 B2 | 4/2016 | Anderson |
| 9,330,494 B2 | 5/2016 | Schultz |
| 9,424,373 B2 | 8/2016 | Zebedin |
| 9,437,033 B2 | 9/2016 | Sun et al. |
| 9,520,000 B2 | 12/2016 | Freund et al. |
| 9,542,738 B2 | 1/2017 | Schults et al. |
| 10,178,303 B2 | 1/2019 | Castillo et al. |
| 2010/0150431 A1* | 6/2010 | Chen ................... G06V 20/176 382/154 |
| 2013/0069944 A1 | 3/2013 | Altman et al. |
| 2013/0155109 A1 | 6/2013 | Schultz et al. |
| 2013/0222375 A1 | 8/2013 | Neophytou et al. |
| 2014/0195275 A1 | 7/2014 | Pershing et al. |
| 2014/0198978 A1* | 7/2014 | Chen ...................... G06T 17/05 382/154 |
| 2014/0200861 A1* | 7/2014 | DeVito ................. G06F 30/13 703/2 |
| 2014/0237430 A1 | 8/2014 | Thornberry et al. |
| 2014/0278570 A1* | 9/2014 | Plummer ................ G06T 7/187 705/4 |
| 2014/0278697 A1 | 9/2014 | Thornberry et al. |
| 2014/0320485 A1 | 10/2014 | Neophytou et al. |
| 2014/0320488 A1 | 10/2014 | Ege |
| 2014/0368507 A1 | 12/2014 | Altman et al. |
| 2014/0369595 A1 | 12/2014 | Pavlidis et al. |
| 2015/0029182 A1 | 1/2015 | Sun et al. |
| 2015/0029188 A1 | 1/2015 | Ege et al. |
| 2015/0172628 A1 | 6/2015 | Brown et al. |
| 2015/0221128 A1 | 8/2015 | Bhatawadekar et al. |
| 2015/0371112 A1 | 12/2015 | Sun et al. |
| 2016/0224696 A1 | 8/2016 | Bhatawadekar et al. |
| 2016/0292312 A1 | 10/2016 | Saha et al. |
| 2016/0292868 A1 | 10/2016 | Hu et al. |
| 2016/0350969 A1 | 12/2016 | Castillo et al. |
| 2016/0371875 A1 | 12/2016 | Sun et al. |
| 2016/0371882 A1 | 12/2016 | Ege et al. |
| 2017/0061684 A1 | 3/2017 | Bhatawadekar et al. |
| 2017/0064200 A1 | 3/2017 | Castillo et al. |
| 2017/0082750 A1 | 3/2017 | Schultz et al. |
| 2017/0116707 A1 | 4/2017 | Upendran et al. |
| 2017/0132835 A1 | 5/2017 | Halliday et al. |
| 2017/0208245 A1 | 7/2017 | Castillo et al. |
| 2017/0236024 A1 | 8/2017 | Wang et al. |

FOREIGN PATENT DOCUMENTS

| | | |
|---|---|---|
| WO | 2014/151122 A1 | 9/2014 |
| WO | 2015/061735 A1 | 4/2015 |
| WO | 2015/116962 A1 | 8/2015 |

OTHER PUBLICATIONS

Zhou et al. "Seamless Fusion of LiDAR and Aerial Imagery for Building Extraction", IEEE Transactions On Geoscience and Remote Sensing, vol. 52, No. 11, Nov. 2014, p. 7393-7407 (Year: 2014).*

Ioannou et al. "Difference of Normals as a Multi-Scale Operator in Unorganized Point Clouds", 2012 Second International Conference on 3D Imaging, Modeling, Processing, Visualization & Transmission, Oct. 13-15, 2012 (Year: 2012).*

Data fusion of high-resolution satellite imagery and LiDAR data for automatic building extraction, by G. Sohn and I. J. Dowman in ISPRS Journal of Photogrammetry and Remote Sensing, May 2007 (22 pages).

Automatic and threshold-free evaluation of 3D building roof reconstruction techniques, by M. Awrangjeb and C. S. Fraser, in IGARSS 2013, pp. 3970-3973 (5 pages).

* cited by examiner

1: procedure COMPUTENORMALS(*points, ϵ, tol*)
2:     $acc \leftarrow [\,]$
3:     for point in points do
4:        $vectors \leftarrow [\,]$
5:        $neighbors \leftarrow p \in points$ such as $dist(p, point) \leq \epsilon$
6:        for neighbor in neighbors do
7:           $vectors \leftarrow neighbor - point$
8:        for $vector_i$ in vectors do
9:           for $vector_j$ in $vectors, i \neq j$ do
10:              $cross_{i,j} \leftarrow crossprod(vector_i, vector_j)$
11:              if $cross_{i,j}[2] \leq 0$ then
12:                 $cross_{i,j} \leftarrow -cross_{i,j}$
13:              if $\exists cross_k \in acc$ such as $dist(cross_{i,j}, cross_k) \leq tol$ then
14:                 $acc[cross_k] \leftarrow acc[cross_k] + 1$
15:                 update $cross_k$ by averaging with additional cross
16:              else
17:                 $acc \leftarrow [cross_{i,j}, 1]$
18:     $Normal \leftarrow$ best cross in $acc$, most vectors contributing

FIG. 4A

AUTOMATED ROOF SURFACE MEASUREMENT FROM COMBINED AERIAL LIDAR DATA AND IMAGERY

CROSS REFERENCE TO RELATED APPLICATION(S)

The present application claims the benefit of U.S. provisional patent application No. 62/619,385, filed Jan. 19, 2018, and U.S. provisional patent application No. 62/701,093, filed Jul. 20, 2018, the entirety of each of which are hereby incorporated by reference.

BACKGROUND OF THE INVENTION

1. Field of the Invention

This application is directed to the field of computer modeling and specifically the automatic generation of a 3D model of a roof of a building.

2. Description of the Related Art

In fields such as roof repair, solar panel installation, and insurance, it is important to have accurate roof measurements. Such measurements are critical in planning work, and providing accurate quotes/estimates to potential clients. Unfortunately, taking manual measurements of a roof can be a tedious task—it requires technicians to travel to a building site, and can be very time consuming. There is therefore a need for improved roof measurement techniques which help alleviate these issues.

SUMMARY OF THE INVENTION

The following is a summary of the invention, which should provide to the reader a basic understanding of some aspects of the invention. This summary is not intended to identify critical elements of the invention or in any way to delineate the scope of the invention. The sole purpose of this summary is to present in simplified text some aspects of the invention as a prelude to the more detailed description presented below.

Because of these and other problems in the art, discussed herein among other things is a computer-implemented method for automatically generating a 3D model of a roof of a building is provided. The method includes receiving point cloud data comprising a plurality of data points corresponding to height measurements at a given location; processing the point cloud data to identify roof surfaces; generating a 3D model of the roof using the identified surfaces; receiving aerial imagery of the roof; registering the aerial imagery with the point cloud data; and refining the 3D model using the aerial imagery.

According to an aspect, a non-transitory computer readable medium is provided. The computer readable medium has instructions stored thereon which, when executed by a processor, cause the processor to perform the steps of: receiving point cloud data comprising a plurality of data points corresponding to height measurements at a given location; processing the point cloud data to identify roof surfaces; generating a 3D model of the roof using the identified surfaces; receiving aerial imagery of the roof; registering the aerial imagery with the point cloud data; and refining the 3D model using the aerial imagery.

According to an aspect, a computing system for automatically generating a 3D model of a roof of a building is provided. The computing system includes: an input module configured to receive: point cloud data comprising a plurality of data points corresponding to height measurements at a given location; and aerial imagery of the roof; a processing module configured to: process the point cloud data to identify roof surfaces; generate a 3D model of the roof using the identified surfaces; register the aerial imagery with the point cloud data; and refine the generated 3D model using the aerial imagery; and an output module for transmitting, displaying and/or storing the refined 3D model.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

FIG. 4A illustrates pseudocode for computing normal of each LiDAR point, according to an embodiment.

DETAILED DESCRIPTION OF THE PREFERRED EMBODIMENT(S)

What follows describes preferred embodiments of systems and methods for automated roof surface measurement, and provides examples for possible implementations including user interfaces and system components. These are but one of many different possible implementations. As such, the examples provided should not be taken as to limit the scope of the invention in any way.

Figure 1A:
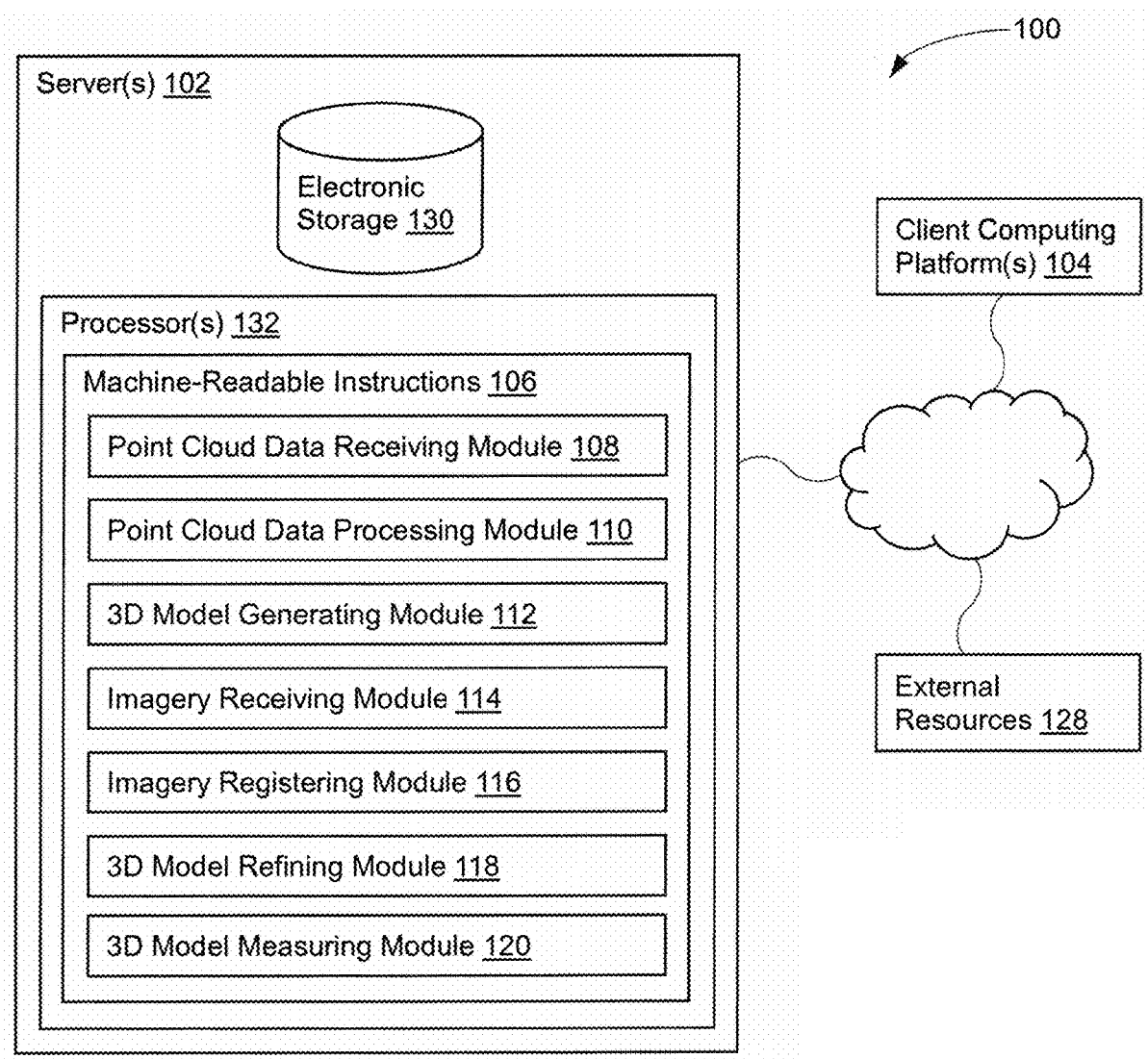
FIGS. 1A and 1B illustrate computer systems for automatically measuring a roof, according to exemplary embodiments.

FIG. 1A illustrates a system 100 configured for automatically measuring a roof of a building, in accordance with one or more implementations. Broadly described, the system 100 is configured to receive and process aerial data of a roof of a building, and to generate a 3D model therefrom. The computer system 100 can subsequently measure the 3D model in order to obtain accurate measurements of the roof represented in the aerial data.

In some implementations, system 100 can include one or more servers 102. Server(s) 102 can be configured to communicate with one or more client computing platforms 104 according to a client/server architecture and/or other architectures. Client computing platform(s) 104 can be configured to communicate with other client computing platforms via server(s) 102 and/or according to a peer-to-peer architecture and/or other architectures. Users can access system 100 via client computing platform(s) 104.

Server(s) 102 can be configured by machine-readable instructions 106. Machine-readable instructions 106 can include one or more instruction modules. The instruction modules can include computer program modules. In the present embodiment, the instruction modules include one or more of: a point cloud data receiving module 108, a point cloud data processing module 110, a 3D model generating module 112, an imagery receiving module 114, an imagery registering module 116, a 3D model refining module 118, and a 3D model measuring module 120. The operation of each of these modules will be described in more detail herein below. It is appreciated, however that other modules can be provided in different implementations.

As will be described in more detail hereinafter, system 100 can be configured to operate using external resources 128, such as sources of information outside of system 100, external entities participating with system 100, and/or other resources. It is appreciated, however that in some implementations, some or all of the functionality attributed herein to external resources 128 can be provided by resources included in system 100.

In some implementations, server(s) 102, client computing platform(s) 104, and/or external resources 128 can be operatively linked via one or more electronic communication links. For example, such electronic communication links can be established, at least in part, via a network such as the Internet and/or other networks. It will be appreciated that this is not intended to be limiting, and that the scope of this disclosure includes implementations in which server(s) 102, client computing platform(s) 104, and/or external resources 128 may be operatively linked via some other communication media.

A given client computing platform 104 can include one or more processors configured to execute computer program modules. The computer program modules can be configured to enable a user or external system associated with the given client computing platform 104 to interface with system 100 and/or external resources 128, and/or provide other functionality attributed herein to client computing platform(s) 104. By way of non-limiting example, the given client computing platform 104 can include one or more of a desktop computer, a laptop computer, a handheld computer, a tablet computing platform, a NetBook, a Smartphone, a gaming console, and/or other computing platforms such as an external server.

Server(s) 102 can include electronic storage 130, one or more processors 132, and/or other components. Server(s) 102 can include communication lines, or ports to enable the exchange of information with a network and/or other computing platforms. Illustration of server(s) 102 in FIG. 1A is not intended to be limiting. Server(s) 102 can include a plurality of hardware, software, and/or firmware components operating together to provide the functionality attributed herein to server(s) 102. For example, server(s) 102 can be implemented by a cloud of computing platforms operating together as server(s) 102.

Electronic storage 130 can comprise non-transitory storage media that electronically stores information. The electronic storage media of electronic storage 130 can include one or both of system storage that is provided integrally (i.e., substantially non-removable) with server(s) 102 and/or removable storage that is removably connectable to server(s) 102 via, for example, a port (e.g., a USB port, a firewire port, etc.) or a drive (e.g., a disk drive, etc.). Electronic storage 130 can include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 130 can include one or more virtual storage resources (e.g., cloud storage, a virtual private network, and/or other virtual storage resources). Electronic storage 130 can store software algorithms, information determined by processor(s) 132, information received from server(s) 102, information received from client computing platform(s) 104, and/or other information that enables server(s) 102 to function as described herein.

Processor(s) 132 can be configured to provide information processing capabilities in server(s) 102. As such, processor(s) 132 can include one or more of a digital processor, an analog processor, a digital circuit designed to process information, an analog circuit designed to process information, a state machine, and/or other mechanisms for electronically processing information. Although processor(s) 132 is shown in FIG. 1A as a single entity, this is for illustrative purposes only. In some implementations, processor(s) 132 can include a plurality of processing units. These processing units can be physically located within the same device, or processor(s) 132 can represent processing functionality of a plurality of devices operating in coordination. Processor(s) 132 can be configured to execute modules 108, 110, 112, 114, 116, 118 and/or 120, and/or other modules. Processor(s) 132 can be configured to execute said modules by software; hardware; firmware; some combination of software, hardware, and/or firmware; and/or other mechanisms for configuring processing capabilities on processor(s) 132. As used herein, the term "module" can refer to any component or set of components that perform the functionality attributed to the module. This can include one or more physical processors during execution of processor readable instructions, the processor readable instructions, circuitry, hardware, storage media, or any other components.

It should be appreciated that although modules 108, 110, 112, 114, 116, 118, and/or 120 are illustrated in FIG. 1A as being implemented within a single processing unit, in implementations in which processor(s) 132 includes multiple processing units, one or more of modules 108, 110, 112, 114, 116, 118, and/or 120 can be implemented remotely from the other modules. The description of the functionality provided by the different modules 108, 110, 112, 114, 116, 118, and/or 120 described below is for illustrative purposes, and is not intended to be limiting, as any of modules 108, 110, 112, 114, 116, 118, and/or 120 can provide more or less functionality than is described. For example, one or more of modules 108, 110, 112, 114, 116, 118, and/or 120 can be eliminated, and some or all of its functionality can be provided by other ones of modules 108, 110, 112, 114, 116, 118, and/or 120. As another example, processor(s) 132 can be configured to execute one or more additional modules that may perform some or all of the functionality attributed below to one of modules 108, 110, 112, 114, 116, 118, and/or 120.

Figure 1B:
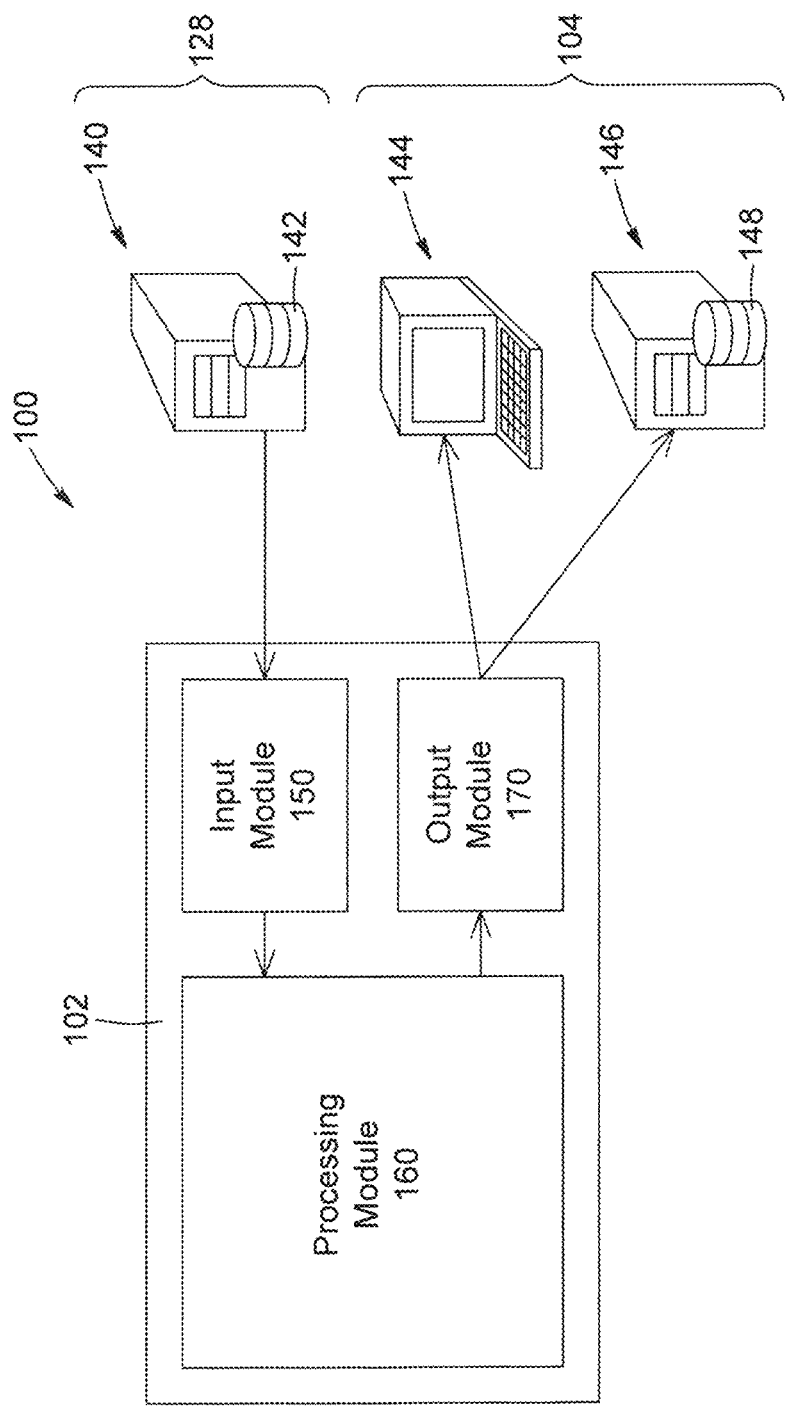

For example, with reference to FIG. 1B, system 100 can be configured with a data input module 150 for receiving aerial data for processing, such as from an external resource 128 such as an external computer system 140 and/or database 142. Data input module 150 can, for example, implement the functionality of point cloud data receiving module 108, imagery receiving module 114, and/or other modules for receiving different types of data needed to implement the processing steps described hereinafter. System 100 can further be configured with processing module 160 in communication with data input module 150 for processing received aerial data to generate a 3D model of a roof and/or measure said roof. Processing module can, for example, implement the functionality of one or more of: point cloud data processing module 110, 3D model generating module 112, imagery registering module 116, 3D model refining module 118, and 3D model measuring module 120. System 100 can further be configured with output module 170 in communication with processing module 160, for example to transmit data (such as reports, measurements, models, and other data which will be described in more detail hereinbelow) to client devices 104, such as remote computing device 144, storage server 146 and/or database 148.

The systems described above can be configured to implement a method for automatically generating a 3D model of a roof of a building using one or at least two different formats of aerial data. In the present disclosure, aerial data refers to any data representative of a building and/or surrounding area which was acquired from a perspective above the building and/or surrounding area. For example, the data could have been acquired via an air plane, drone, satellite, and/or any other flying or orbiting device, and/or any other sensor positioned at an altitude.

Figure 3A:
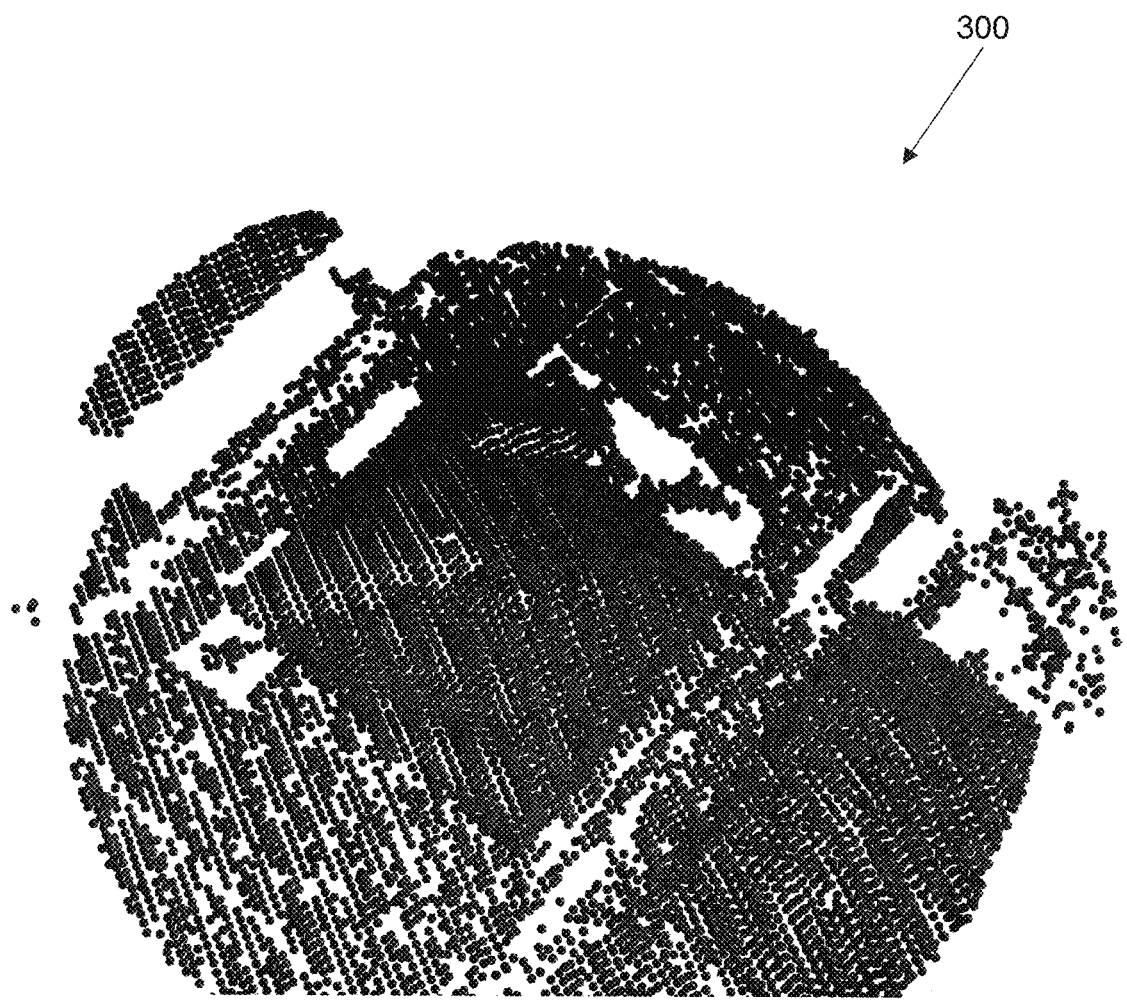
FIG. 3A illustrates a first format of aerial data, corresponding to a 3D point cloud of aerial LiDAR data of a given area.
Figure 8:
FIG. 8 illustrates a second format of aerial data, corresponding to a 2D aerial RGB image representing a roof of a building.

The aerial data can be provided in a number of different formats, depending on the type of data acquired and the sensors used to acquire the data. For example, a first format of the data can correspond to point cloud data, such as 3D elevation data of the building and/or surrounding area represented using a collection of unstructured points in 3D space. Another format of the data can correspond to 2D imagery, such as a raster image representing a top plan view of the building and/or surrounding area using a matrix of color, grayscale or binary pixels. It is appreciated that other data formats are possible, representing views of the building and/or surrounding area in 2D, 3D and/or representing different aspects of the same. In the exemplary embodiment described hereinafter, a first format of aerial data corresponds to aerial 3D Light Detection and Ranging (LiDAR) data provided as a point cloud 300 as illustrated in FIG. 3A, and a second format of aerial data corresponds to 2D aerial imagery provided as an RGB raster image 800, as illustrated in FIG. 8. It is appreciated, however, that other combinations of aerial data are possible in other embodiments.

Figure 2:
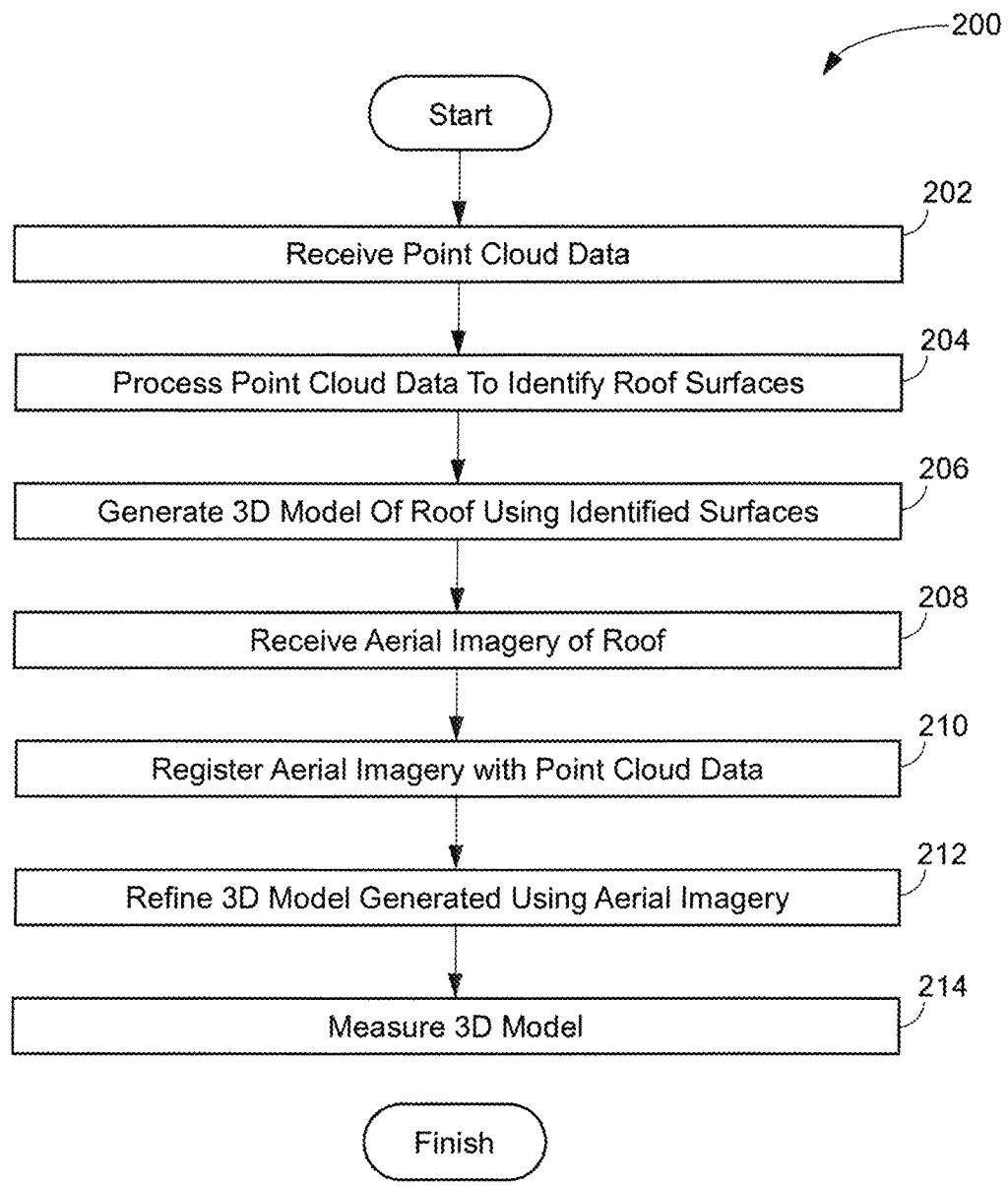
FIG. 2 illustrates a method for automatically measuring a roof, according to an embodiment.

FIG. 2 illustrates a method 200 for automatically generating a 3D model of a roof of a building, in accordance with one or more implementations. The operations of method 200 presented below are intended to be illustrative. In some implementations, method 200 can be accomplished with one or more additional operations not described, and/or without one or more of the operations discussed. Additionally, the order in which the operations of method 200 are illustrated in FIG. 2 described below is not intended to be limiting.

In some implementations, method 200 can be implemented in one or more processing devices (e.g., a digital processor, an analog processor, a digital circuit designed to process information, an analog circuit designed to process information, a state machine, and/or other mechanisms for electronically processing information). The one or more processing devices can include one or more devices executing some or all of the operations of method 200 in response to instructions stored electronically on an electronic storage medium. The one or more processing devices can include one or more devices configured through hardware, firmware, and/or software to be specifically designed for execution of one or more of the operations of method 200.

With reference to FIG. 2, a first operation 202 can include receiving point cloud data including a plurality of data points corresponding to height measurements at a given location. Operation 202 can be performed by one or more hardware processors configured by machine-readable instructions including a module that is the same as or similar to point cloud data receiving module 108, in accordance with one or more implementations.

Figure 3B:
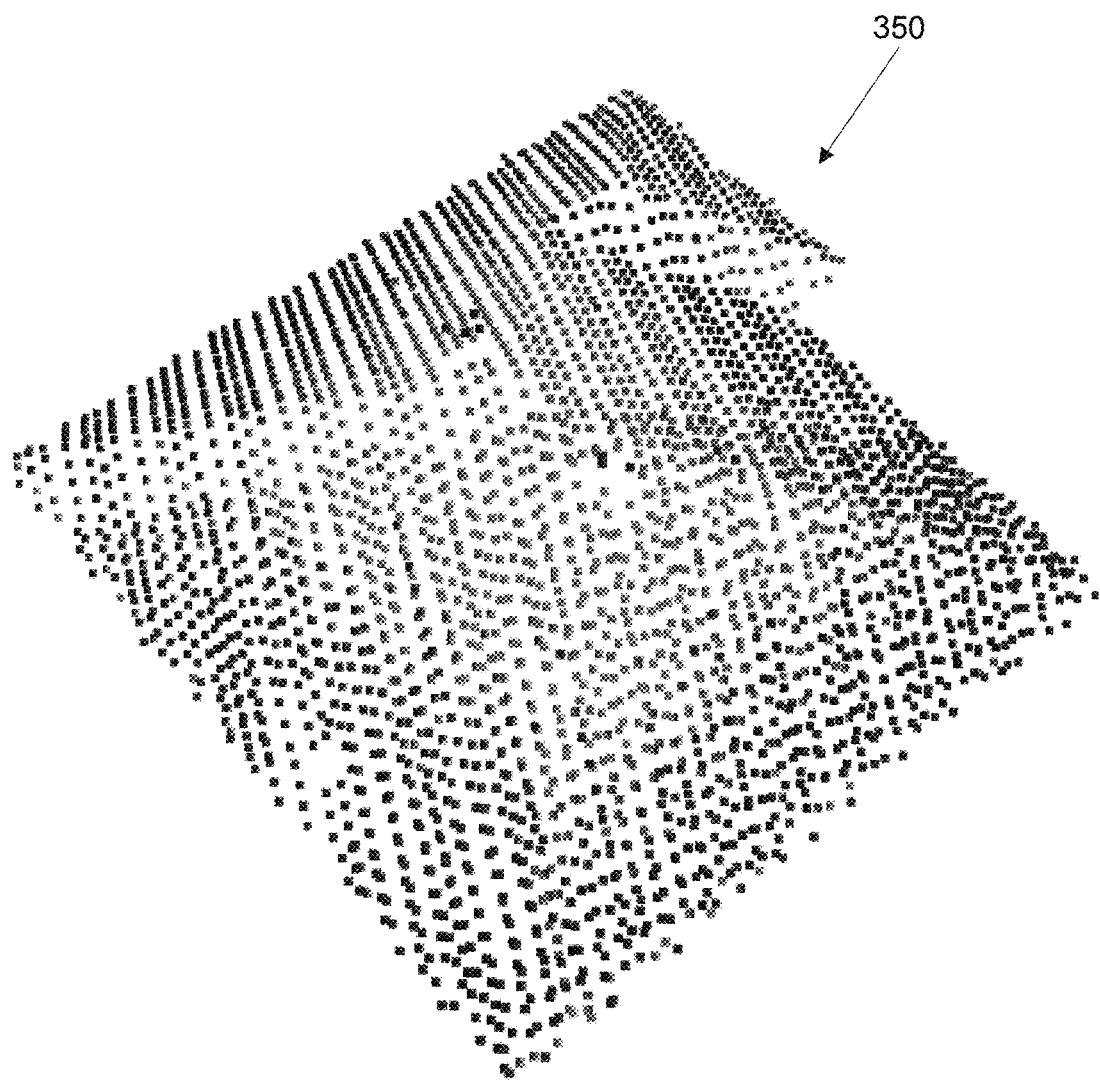
FIG. 3B illustrates point cloud data points isolated from the point cloud of FIG. 3A, said point cloud data corresponding to a roof of a building.

In the present embodiment, the point cloud data is received in the form of LiDAR data 300, for example as illustrated in FIG. 3A. As can be appreciated, the LiDAR data 300 can be received from different sources. For example, the LiDAR data 300 may have been previously acquired by aerial surveyors, and made available from an external computer system 140 and/or on an external database 142. The LiDAR data 300 can thus be retrieved via input module 110, for example, over a network via an API. Alternatively, in some embodiments, the LiDAR data can be stored locally on system 100, and input module 110 can be configured to retrieve the data from a local database. As can be appreciated, in the example illustrated in FIG. 3A, the received LiDAR data is raw data which has not been processed to isolate points corresponding to the building of interest. Accordingly, the data 300 includes data points corresponding to not only the building, but to surrounding objects, such as vegetation, ground, and other buildings. In some embodiments, the received LiDAR data can be classified LiDAR data in which data points corresponding to buildings are classified as such, allowing to easily distinguish and isolate them from data points corresponding to other objects, for example to obtain isolated data points 350 corresponding to the building as shown in FIG. 3B. In some embodiments, the received LiDAR data can be unclassified, and can require a step of data classification to identify and isolate points corresponding to buildings. In yet other embodiments, isolated data points 350 can be received directly from an external source via the input module 110.

In some implementations, the point cloud data can be received for a defined approximate geographical location. For example, the input module 110 can receive an input corresponding to a latitude and longitude of an approximate location of a building, and/or a street address of the building. Such input can be provided, for example, via a user input, or via an API from an external system interfacing with computer system 100, for example such as a client computing platform 104. Upon receiving the approximate location input, the input module 110 can retrieve point cloud data, for example such as raw LiDAR data 300 as shown in FIG. 3A, corresponding to said approximate location. For example, if the geographical location is provided in the form of a latitude and longitude, it can be presumed that the desired building is centered on the provided coordinates, and point cloud data can be retrieved in a predefined radius therearound.

Upon receiving the point cloud data, a second operation 204 can comprise processing the point cloud data to identify roof surfaces. Operation 204 can be performed by one or more hardware processors configured by machine-readable instructions including a module that is the same as or similar to point cloud data processing module 110, in accordance with one or more implementations.

In an embodiment, operation 204 can comprise analyzing the point cloud data to determine if there is a building at the provided approximate geographical location. This can involve pre-processing the data points to distinguish between several close buildings, for example by detecting gaps or separating elements or structures in the point cloud. In an embodiment, a segmentation or classification algorithm can be applied in order to isolate points of a building of interest from neighboring buildings.

In some embodiments, pre-processing the data points can comprise classifying the point cloud data to distinguish points corresponding to buildings from other points. In some embodiments, a deep neural network can be trained to classify LiDAR points into relevant categories, such as building, vegetation or ground. It is appreciated that groups of LiDAR points can also be classified into more granular categories, including roof components or obstacles such as vents, pipes, chimneys, skylights, antennas, etc. It is further appreciated that the architecture of the deep neural network can allow for different numbers of points to be provided as an input, thereby allowing classification to be performed on an arbitrary number of points. For example, the architecture of the deep neural network can be of the type PointNet, PointNet++, or other such architectures. Finally, as can be further appreciated, the neural network can be trained using publicly available or crowdsourced data.

In some embodiments, segmentation or classification can be facilitated by applying a clustering algorithm to isolate points falling on a roof of a building of interest from those falling on roofs of neighbouring buildings. For example, a center point in the received LiDAR data can be presumed as falling on a building of interest, and the clustering algorithm can be used to retain all points which are within a predetermined distance from the center point and/or all points which are within a predetermined distance from another point which has already been determined to be part of the building of interest. As can be appreciated, the isolated points may not only include points falling on the roof of the building, but also LiDAR points having bounced off of walls, balconies, branches close to the roof, animals on the roof, etc. These points can be identified as outliers and discarded in subsequent steps. Segmentation and/or classification can be subsequently performed on the retained points in order to differentiate points falling on a roof from surrounding objects.

Once the data points of the roof of interest have been isolated, for example to obtain isolated data points 350 as shown in FIG. 3B, roof surfaces can be extracted. The roof surfaces can correspond to planes and/or curved surfaces which form part of the roof. As illustrated in FIG. 4, the roof surfaces can be extracted by calculating at the location of each of the points a local normal with respect to a local plane. Points with corresponding normals can be subsequently clustered into groups which correspond to the roof surfaces. By way of example, a pseudocode representation of an exemplary normals computation algorithm is provided in FIG. 4A. Although different algorithms are possible, the illustrated algorithm can be advantageous, as it is highly parallelizable, and points bordering two surfaces will have normals pointing in the direction of the normal of one of the two surfaces they border, thus facilitating segmentation in subsequent steps. It is appreciated that other algorithms are also possible in other embodiments, such as the k-means algorithm.

Figure 4B:
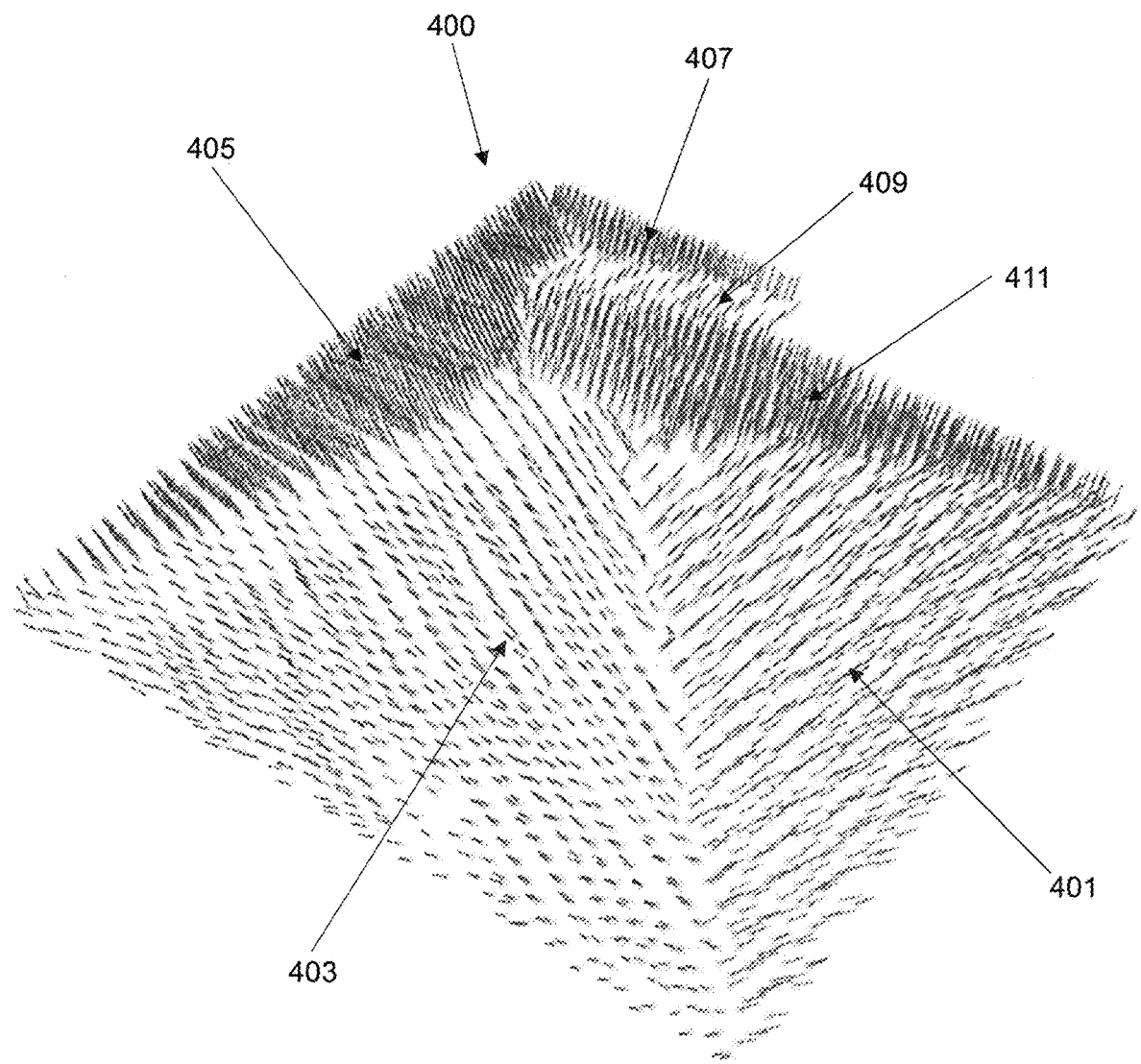
FIG. 4B is a visualization of the computed normals from each LiDAR data point in FIG. 3B according to the pseudocode of FIG. 4A.
Figure 5:
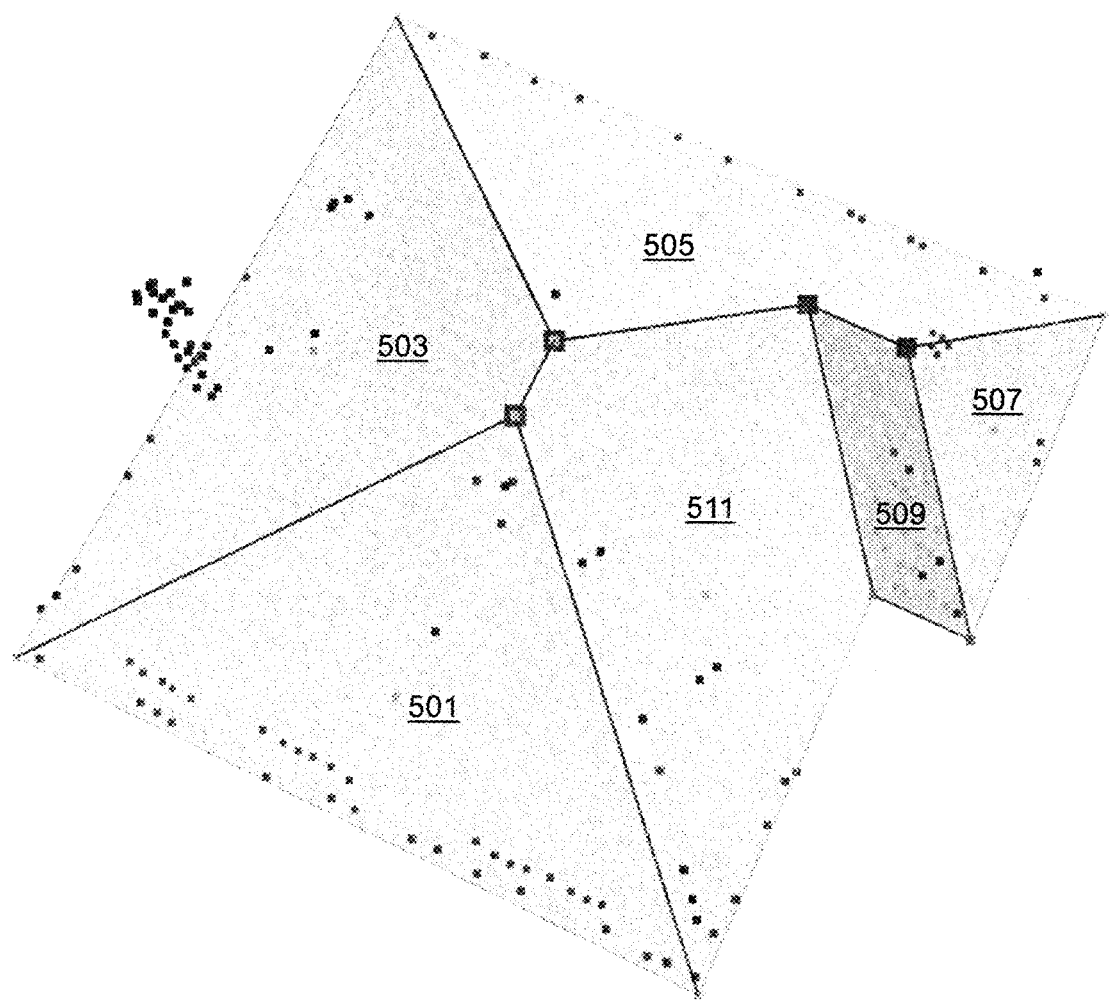
FIG. 5 is a visualization of the LiDAR data point of FIG. 3B grouped into common planes, with outliers having been identified.

A visualization of the calculated normal for each of the LiDAR data points is illustrated in FIG. 4B as vectors 400 emanating from respective data points. After the normals are calculated, the points can be clustered into groups according to the direction of their respective normals, with such groups corresponding to roof surfaces. In an embodiment, a region growing algorithm can be applied in order to combine individual points having normal directions corresponding to an expected surface shape. For example, it can be assumed that all surfaces on the roof are planes, and points having a similarly oriented normal can be combined into common planes which correspond to respective roof surfaces. For example, as shown in FIGS. 4B and 5, a first group of points with similar normal 401 can be grouped into a first surface 501, a second group 403 into a second surface 503, and so on for point groups 405, 407, 409 and 411 with surfaces 505, 507, 509, and 511. Points can also be combined based on their distance from a given plane. For example, each plane can be defined in the format $Ax+By+Cz+D=0$ where $(A, B, C)$ is the normal vector, and $D$ is a distance parameter. A point can be considered "near" a plane if its normal is oriented similarly (i.e. within a predetermined threshold) to the global normal of the region. A point can also be considered "near" a plane if its is within a predetermined distance from a given plane. It is appreciated that a similar process can be applied to group points into different shaped roof surfaces, such as curved surfaces, for example using different functions to define the surface.

Once surfaces and/or planes have been roughly identified, the points can be further processed to further refine the surfaces, and to identify and/or discard outliers. For example, points with uncertain normals can be analyzed in order to determine which of the identified surfaces best corresponds to said points, if any. As can be appreciated, the uncertainty of points can be calculated using different methods, such as a heuristics analysis, for example by constructing an accumulator. In an embodiment, each point can be compared to each surface, and have its normal recalculated exclusively with points on that surface. If the normal doesn't match that of the surface and/or if the point is too far away from the surface, the surface can be rejected. As can be appreciated, the process can be repeated for each surface in order to identify a surface whose normal direction best matches that of the point and/or whose distance is closest if no surfaces are within a predetermined threshold of normal direction and/or distance, all surfaces can be rejected, and the point can be classified as an outlier. In some cases, two or more planes can yield comparable results for a single point. In such scenarios, the point can be considered as falling on a boundary between two or more surfaces. The point can thus be replicated such that there is a copy which can be assigned to each of the surfaces. In the visualization of FIG. 5, points belonging to common planes 501, 503, 505, 507, 509, and 511 are drawn in grayscale, whereas points drawn in black correspond to points which have been identified as outliers.

After the surfaces have been appropriately identified and refined, a third operation 206 can comprise generating a 3D model of the roof using the identified surfaces. Operation 206 can be performed by one or more hardware processors configured by machine-readable instructions including a module that is the same as or similar to 3D model generating module 112, in accordance with one or more implementations.

Figure 6:
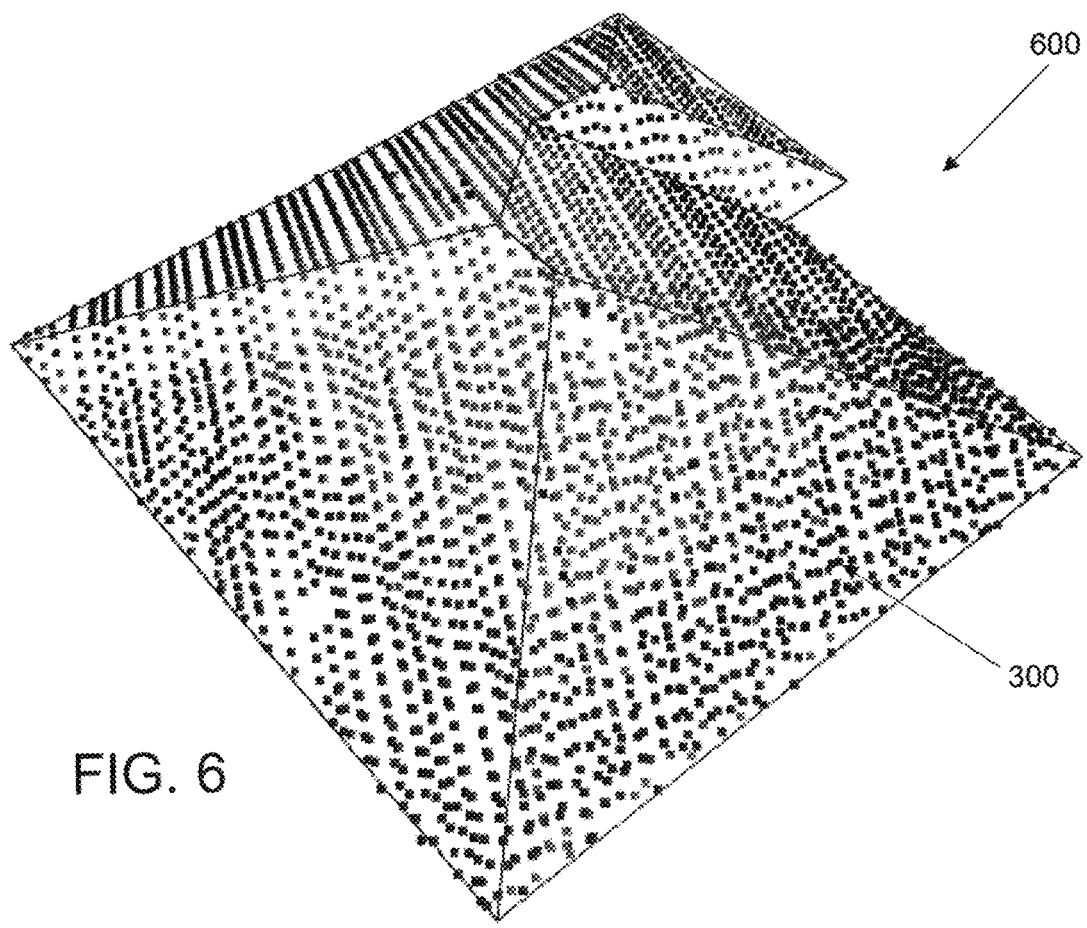
FIG. 6 is a visualization of a 3D shell model generated from the LiDAR data points of FIG. 3B, the 3D shell model being shown superimposed on the LiDAR data points.

In the present embodiment, the generated 3D model corresponds to a shell model representing the surfaces of the roof. The 3D model can be a polygonal model, comprising a plurality of connected geometric shapes or a polygon mesh defined by line segments extending between vertices, and/or a curve model. As can be appreciated, the 3D model is a simplified representation of the roof in which the roof is defined by a plurality of shapes rather than a cloud of individual points. In such a representation, the shapes and boundaries of the roof can be clearly defined, easily measured and more easily stored and reconstructed. An exemplary roof 3D shell model 600 generated from LiDAR data points is shown in FIG. 6. For illustrative purposes, the 3D shell 600 is shown superimposed on the isolated LiDAR data points 350.

Figure 7:
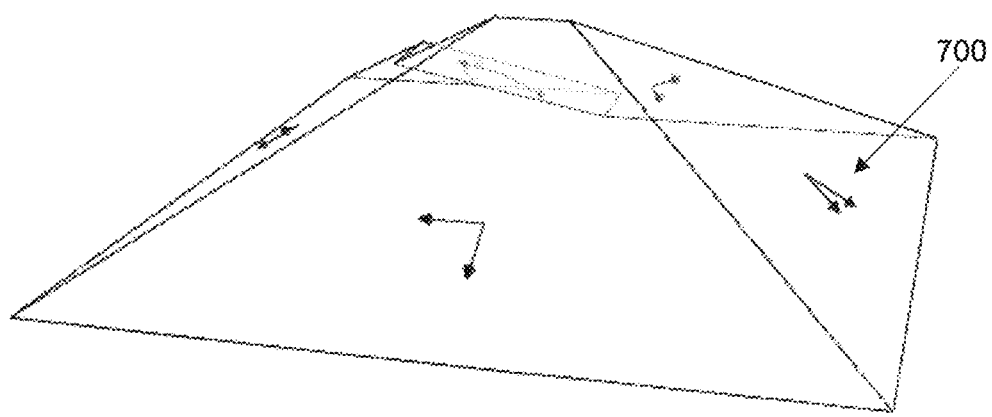
FIG. 7 illustrates the principle axes for each of the roof surfaces in the 3D shell model of FIG. 6, determined using the direction of the steepest gradient.

As can be appreciated, generating the 3D model can require considering the position and appearance of all lines defining the roof, both internal and external. The processing module can receive a list of surfaces that includes all points in each surface. Intersection lines defining the internal edges of the roof can be calculated and refined by identifying intersections between the surfaces, thus defining the internal topology of the roof. The external edges of the 3D model can be estimated by interpolating a set of lines with respect to external-most points of each outside roof surface. In some embodiments, the interpolation can favor the principal axes 700 of the building roof, as illustrated in FIG. 7. The principal axes 700 of each roof surface can be determined, for example, using the direction of the steepest gradient.

As can be appreciated, while some roofs can have a rather simple internal topology, other roofs can be more complex and can comprise sub-roofs, for example, which do not have any intersecting lines. For such surfaces, a simple polygon that minimizes the distance between the boundary points of the point cluster associated with the roof surfaces can be estimated.

In some embodiments, a topology graph can be constructed, and such a graph can be analyzed to identify topological features. The 3D model can be subsequently built to match the topology graph. This graph can also be used to detect missing internal intersection points and/or missing internal lines. Furthermore, they can be used to train a machine learning algorithm aiming at detecting topological anomalies that can then be corrected using a graph-edit-dictionary approach for instance.

Figure 20:
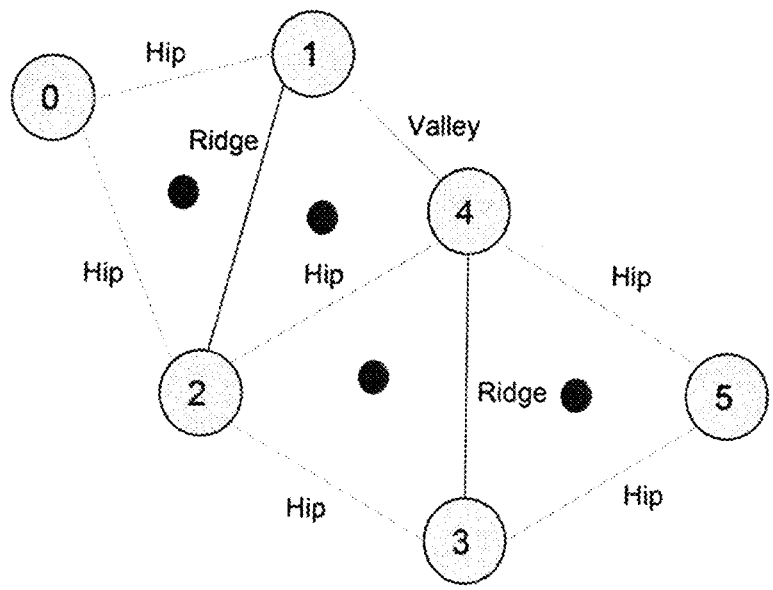
FIG. 20 illustrates a method for identifying interior topological features of a roof surface using graph theory, according to an embodiment.

An exemplary topology graph for identifying topological features is shown in FIG. 20. In the illustrated example, the topology graph represents a roof having 6 surfaces in total. The nodes of the graph (indicated as nodes 0 to 5) represent roof surfaces, whereas the graph edges between two nodes represent intersection lines between the two roof surfaces represented by the nodes. Each graph edge (i.e. intersection line) can have its type (i.e. hip, valley or ridge) embedded as a label assigned to the graph edge. As can be appreciated, the graph can be analyzed in order to detect missing internal intersection points and/or missing internal lines. For example, a minimum cycle in the graph represents three or more surfaces intersecting, and those three or more surfaces must intersect at a given point. Therefore, the graph can be analyzed to calculate minimum cycles, and identify that an intersection point must exist between the surfaces represented by the nodes in the minimum cycle. The identified intersection points are represented as large black dots in the illustrated example. Once intersection points have been identified, it can be determined whether such points exist in the 3D model generated according to the method described above. If such points are missing, the 3D model can be adjusted such that it matches the topology graph, and missing intersection lines can be inferred from the identified intersection points.

In some embodiments, the estimation of the exterior lines of the roof can be solved as an optimization problem. The optimization problem can involve finding a solution to minimize the distance between the LiDAR points at the border of the point cloud and the estimated exterior lines of the roof. The optimization can be carried out, for example, using constraints based on local principal directions of the roof surface and end points of previously estimated internal roof lines.

As can be appreciated, the solution of such an optimization problem can be heavily dependent on initialization, as it is non-convex and non-linear. Accordingly, initializing the optimization problem can comprise selecting a plurality of points in the LiDAR point cloud to serve as initial values. For example, the initial values can be selected by identifying critical points near the external border of the LiDAR point cloud to define segments needed to build the exterior boundary of each roof surface. In an embodiment, identifying the critical points can comprise identifying first and second free end points of intersection lines which need to be connected via exterior roof lines to define a closed roof surface, and identifying points in the LiDAR point cloud proximate to a boundary of the point cloud which are positioned between the first and second free end points. A sequence of points can thus be constructed from the identified points, and the point sequence can be smoothed, for example using a 3-point mean filter. Next, critical points can be identified in the sequence, for example by calculating a curvature of the sequence at each point, and identifying points having a curvature above a predetermined value. The identified critical points can thus be retained as initial values to define an initial number and position of segments needed to build the exterior boundary of the roof surface and connect the first and second free end points. In other words, the optimization problem can be initialized with preliminary estimated exterior lines connecting a sequence of points comprising the critical points and the first and second end points.

Once the optimization problem has been initialized, it can be solved by adjusting the position of the critical points to minimize a distance between the lines connecting the critical points and the LiDAR points at the border of the point cloud. In some embodiments, the problem can be solved in two steps, comprising a first step in which the problem is solved as an unconstrained problem, and a second step in which the results of the first step are used and the problem is solved as a constrained problem. For example, in the first step, the critical points can be repositioned to minimize the distance between the LiDAR points at the border of the point cloud, and the lines connecting the critical points and the first and second end points. The position of the critical points resulting from the optimization can then be used as initial points to initialize a constrained optimization problem in the second step. Thus, in the second step, the critical points can be further repositioned to minimize the distance from the lines to the LiDAR points, while respecting constraints such as the principal directions of the roof surfaces. The positions of the critical points after the second step can be retained as the estimated points defining the exterior lines of the roof surface. As can be appreciated, the solution can be simplified wherever possible. For example, if it is determined that two or more exterior lines are colinear, those lines can be merged into a single line.

Figure 21:
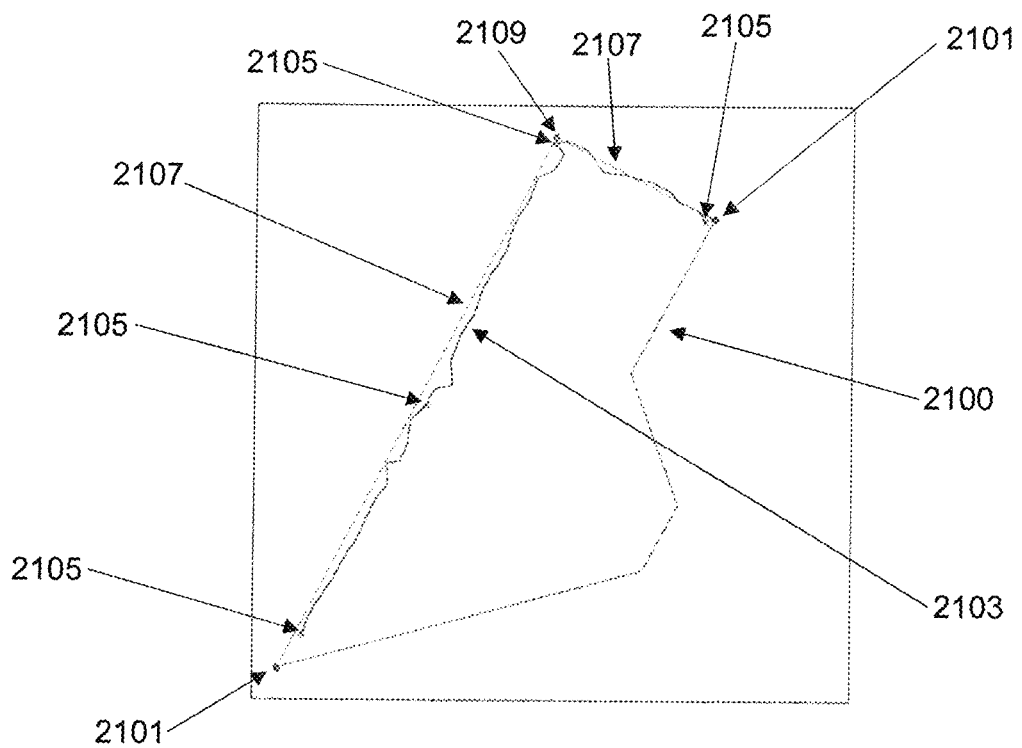
FIG. 21 illustrates a method for estimating external roof edges using an optimization approach, according to an embodiment.

By way of example, FIG. 21 illustrates exterior roof lines estimated by solving an optimization problem as described above. In the illustrated example, previously determined intersection lines defining the interior topology of a roof are denoted by reference character 2100. The roof surface is defined by four connected segments of intersection lines, terminating in first and second free end points, denoted by reference characters 2101. As can be appreciated, the intersection lines define an open curve, and the free end points must be closed by exterior lines to define a closed roof surface. Accordingly, an optimization problem is set up to estimate the configuration of the exterior lines using the LiDAR point cloud data. More specifically, a sequence of points is constructed using points proximate to a boundary of the LiDAR point cloud data and positioned between the first and second free end points 2101. The sequence of points is illustrated in the present example as a line denoted by the reference character 2103. The sequence of points can then be smoothed, and the curvature of each point can be calculated in order to identify critical points. In the illustrated example, the identified critical points are denoted by reference characters 2105. These points are then used to initialize the optimization problem. The optimization can then be carried out to estimate the position and configuration of external line segments (and simplify them if necessary), while minimizing their distance from the critical points. In this case, the optimization results in two segments (illustrated as lines denoted with reference character 2107) connected at a point (illustrated as a dot denoted by reference character 2109), thus defining the estimated external lines of the roof surface. It should be understood that although the internal topology of the roof is quite complex in the present example (four connected segments), the same process can apply to roofs having simpler internal topologies.

In another embodiment, the estimation of the exterior boundary of a roof surface can be performed using a purely data driven strategy. Taking into account the LiDAR points bordering the point cloud representing the roof surface of interest, a line segment can be drawn from one of the two free end points of the intersection lines in the principal direction, such that an error with respect to the bordering LiDAR points is minimized. A maximum length of the segment can be determined based on a maximum allowed distance between one of the neighboring LiDAR points and the end point of the segment. For example, this can involve the steps of first drawing a line starting from one of the two free end points in a direction to minimize an error with respect to the bordering LiDAR points. This line can be of undetermined length, i.e. without a defined end point. Next, the bordering LiDAR points which are within a predetermined distance from the line can be projected onto the line. Finally, the line can be transformed into a segment of finite length by selecting one of the projected LiDAR points to serve as an endpoint for the segment. The LiDAR point can be selected based on which point would result in the segment having the maximum possible finite length. As can be appreciated, a maximum gap between point projections can also be considered to allow for accurate boundary estimation for U-shaped surfaces. Once the line segment has been drawn, it can be determined whether it reaches the other one of the two free end points. If it does not reach, a subsequent segment can be drawn following a direction at 90 degrees to the direction of the previous segment while staying within the plane of the roof surface. The length of the subsequent segment can be determined in the same way, and the process can be repeated iteratively until a segment terminates close enough to the other one of the two free end points to be directly connected thereto. On FIG. 21, this method would first compute one of the straight segments and then compute the second one. A set of constraints with respect to coherent altitudes with respect to the intersection lines end points already determined can allow for rectification of the segments end points at each iteration.

In some embodiments, the two aforementioned estimation methods can be applied, with or without other estimation methods, in order to provide more robust estimations. For example, each estimation method can be applied independently, and a quality score can be computed for the solution obtained from each method. The solution having the best quality score can be retained for subsequent steps. As can be appreciated, the quality score can be computed in a number of different manners. For example, in some embodiments, the quality score can be computed for each roof surface based on a combination of quantities such as: the distance of the LiDAR points to the estimated surfaces at each location as well as the distance of the point cloud boundary to the estimated exterior lines, the number of lines and surfaces found with respect to the total surface of the roof, the presence of self-intersections, etc.

Following the generation of a 3D model using aerial point cloud data, the model can be further refined using aerial data from another source, if necessary. In some embodiments, a quality score can be computed for the 3D model prior to refinement. As can be appreciated, if the quality score is above a predetermined threshold, refinement may not be necessary, and the steps relating to refining the 3D model using aerial data from another source can be skipped. As mentioned above, the quality score can be computed in different ways, for example for each roof surface based on a combination of quantities such as: the distance of the LiDAR points to the estimated surfaces at each location as well as the distance of the point cloud boundary to the estimated exterior lines, the number of lines and surfaces found with respect to the total surface of the roof, the presence of self-intersections, etc. If the quality score is below a predetermined threshold, the model, or a part of it, can be refined or corrected using aerial data from another source as will be described below.

In the present embodiment, the 3D model generated from LiDAR 3D point cloud data can be refined using photogrammetry, and more particularly using aerial imagery of the roof, such as the bitmap or RGB aerial imagery 800 shown in FIG. 8. Accordingly, in an embodiment, the method 200 can comprise an operation 208 of receiving aerial imagery of the roof. The imagery can be acquired from an image provider around a central point, for example around the previously provided geographical location. For example, an RGB image can be downloaded from an external resource 128, such as an image provider, around a central (latitude, longitude) point, and with a predetermined zooming parameter. Operation 208 can be performed by one or more hardware processors configured by machine-readable instructions including a module that is the same as or similar to imagery receiving module 114, in accordance with one or more implementations. In the example illustrated in FIG. 8, the aerial imagery 800 is acquired from Google Maps, but it is appreciated that such imagery can be received from a different external resource or provider.

In order to refine the 3D model using a second source of data, the sources must be co-registered. Accordingly, an operation 210 can comprise registering the aerial imagery with the point cloud data. Operation 210 can be performed by one or more hardware processors configured by machine-readable instructions including a module that is the same as or similar to imagery registering module 116, in accordance with one or more implementations.

Figure 9:
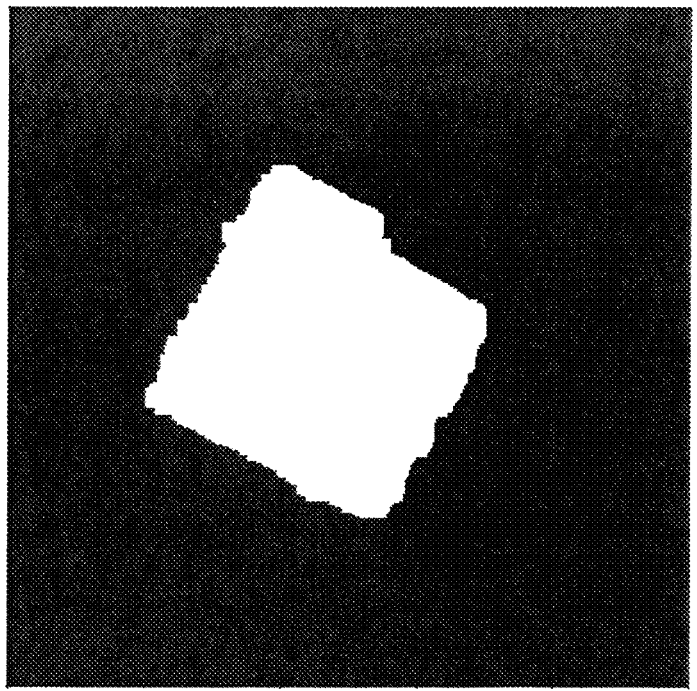
FIG. 9 illustrates a mask generated by projecting the LiDAR data points of FIG. 3B into the image referential of FIG. 8.

For example, it can be assumed that the requested (latitude, longitude) point falls at the center position of the image, i.e. (500,500) on a 1000×1000 pixel image, and matches with a central point on the point cloud data. The point cloud data can be further projected into the same 2D referential as the aerial imagery, and a mask 900 can be generated which represents an approximate footprint of the roof, as illustrated in FIG. 9. As can be appreciated, the algorithm for calculating the projection can vary depending on how the point cloud data was acquired. Depending on the image provider, a different set of equations for the projection may be required. Accordingly, setting information of a camera having acquired the aerial imagery can be received, and the point cloud data can be adjusted to compensate for said setting information when calculating the projection.

Figure 10:
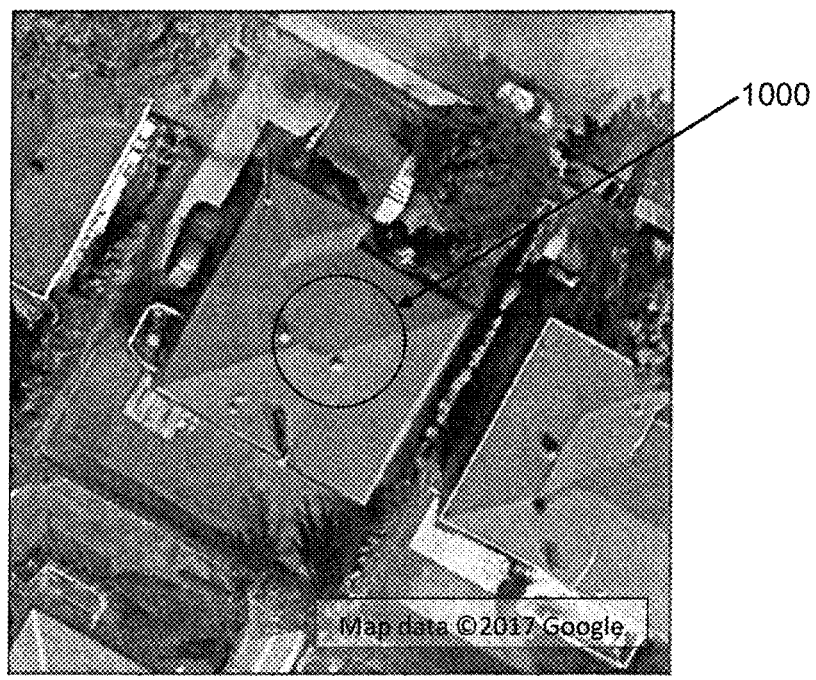
FIG. 10 illustrates a color sample being taken from the roof in the aerial imagery of FIG. 8.
Figure 11:
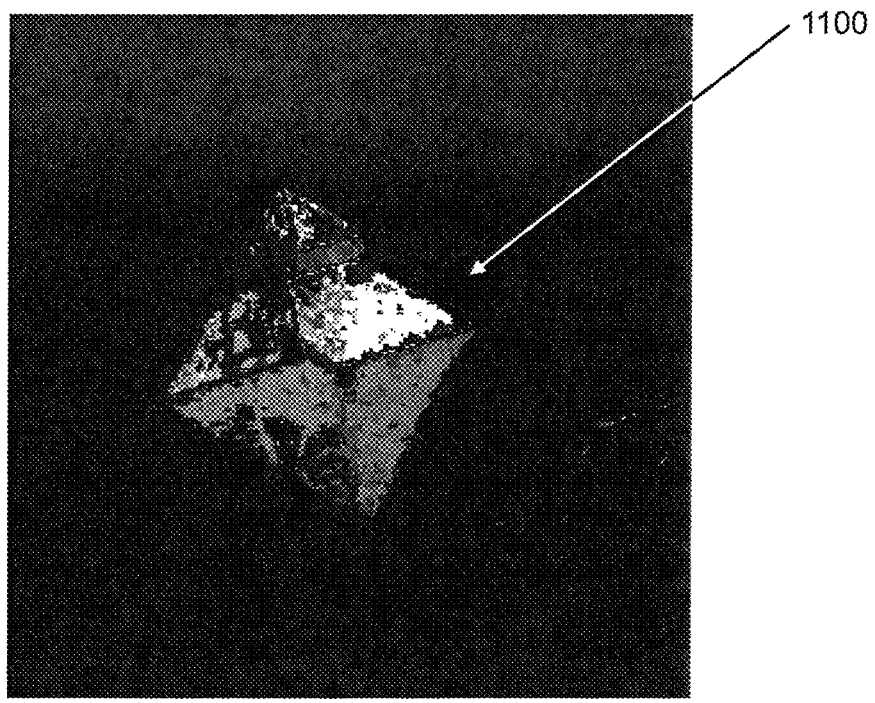
FIG. 11 illustrates regions in the aerial imagery of FIG. 8 which are determined to have colors corresponding to the color samples in FIG. 10.
Figure 12:
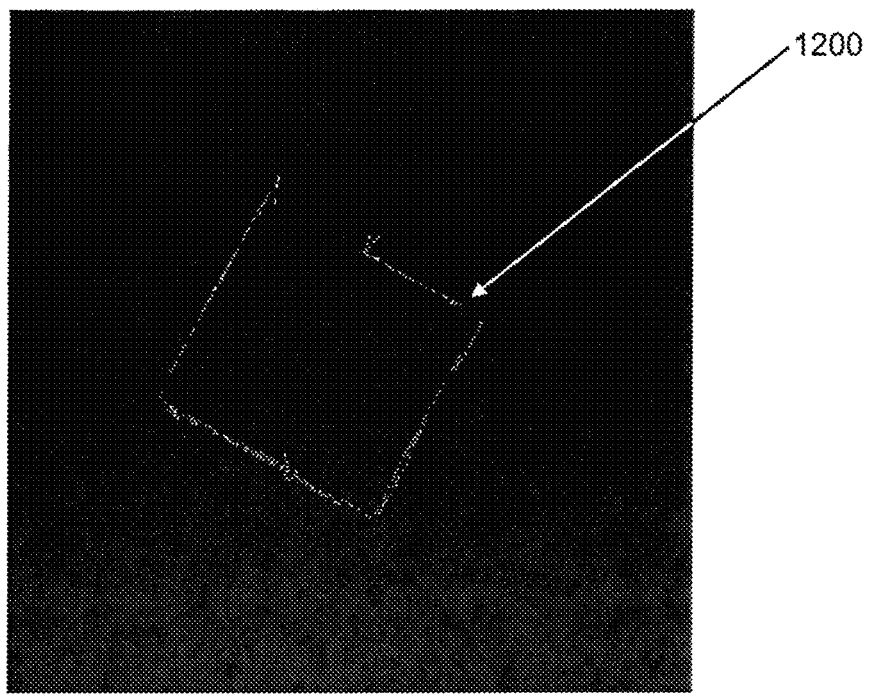
FIG. 12 illustrates contours in the aerial imagery of FIG. 8 falling within the region determined in FIG. 11, said contours corresponding to edges detected on the outside border of the roof.
Figure 13:
FIG. 13 illustrates the LiDAR mask of FIG. 9 co-registered with the aerial imagery of FIG. 8.

In an embodiment, the co-registration of the sources can rely on correlating and aligning contours in the two sources of data. Accordingly, the aerial imagery can be processed in order to identify contours therein corresponding to the roof boundaries. For example, a contour detection algorithm, such as the Canny algorithm, can be applied to identify all contours in the image, and the results can be improved using artifacts deletion, morphological filters such as dilation of edges, or other techniques. In some embodiments, a color-based segmentation can be used to distinguish between the roof and other surrounding objects (such as trees, roads, etc.) and to discard contours which fall outside of the roof. For example, a color sample can be taken from a region 1000 of the aerial image which falls on the roof, as illustrated in FIG. 10, and then regions 1100 of the aerial image having a corresponding color can be identified, as illustrated in FIG. 11. Contours falling outside the identified regions can be discarded. The remaining contours, for example such as the retained contours 1200 shown in FIG. 12, can be correlated with the contours of the previously generated binary mask generated from the LiDAR data. In some embodiments, the co-registration position can be set according to the point of maximum correlation between the contours in the aerial imagery and the contours of the binary mask. The result of the LiDAR mask 900 co-registered with the aerial imagery 800 is shown in FIG. 13. Although techniques involving identifying contours in the aerial imagery and correlating with the contours of the binary mask were described, it is appreciated that alternative methods to determine the co-registration position can be used. For example, the co-registration position can be found using techniques involving a deep neural network. The deep neural network can take an image and a corresponding non-registered point cloud as input and output a binary mask of the position of the point cloud on the image. In some embodiments, the deep neural network can take the same inputs, and output a simple position. As can be appreciated, the deep neural network can be trained, for example, on data manually annotated and/or data that has been crowdsourced.

Once the sources have been co-registered, a subsequent operation 212 can include refining the 3D model using the aerial imagery data. Operation 212 may be performed by one or more hardware processors configured by machine-readable instructions including a module that is the same as or similar to model refining module 118, in accordance with one or more implementations.

Figure 14:
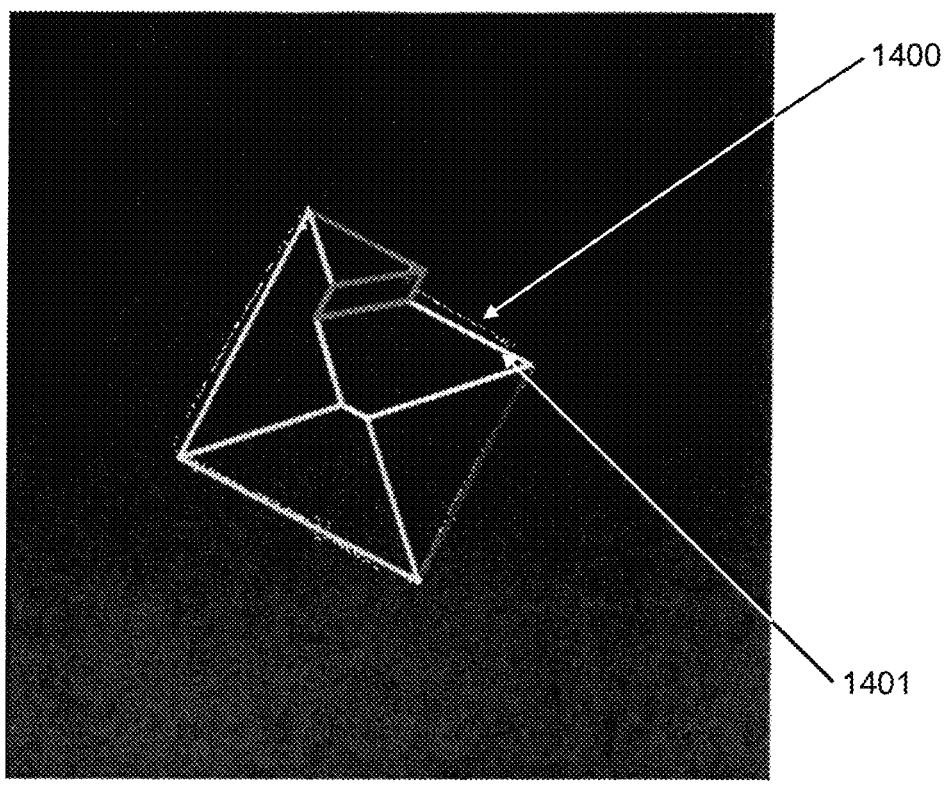
FIG. 14 illustrates the LiDAR hull model projected onto the referential of the aerial imagery of FIG. 8, and superimposed on the outside borders of the roof shown in FIG. 10.

In an embodiment, refining the 3D model can comprise adjusting the 3D model to correspond with the contours identified in the aerial imagery, as shown in FIG. 14. For example, a region of interest in the aerial imagery can be defined around the border of the binary mask, and the LiDAR points 1400 falling in this region can be used to adjust the boundaries 1401 of the surfaces in the 3D model. In some embodiments, the 3D model can comprise a plurality of connected facets or surfaces, and each of these surfaces can be adjusted to better conform with the contours in the aerial imagery, for example by applying geometrical transformations to the surfaces. Such geometric transformations can include a resizing, edge translation, edge rotation, curvature change, or an addition or deletion of an edge. In some embodiments, one or more of the plurality of surfaces can be identified for adjustment. A local error measurement or a heuristic analysis can be used to identify such surfaces for adjustment. For example, the local error measurement can comprise calculating an average distance between points in the point cloud and the 3D model. A heuristic analysis can comprise analyzing and/or measuring a symmetry of the surfaces.

Figure 15:
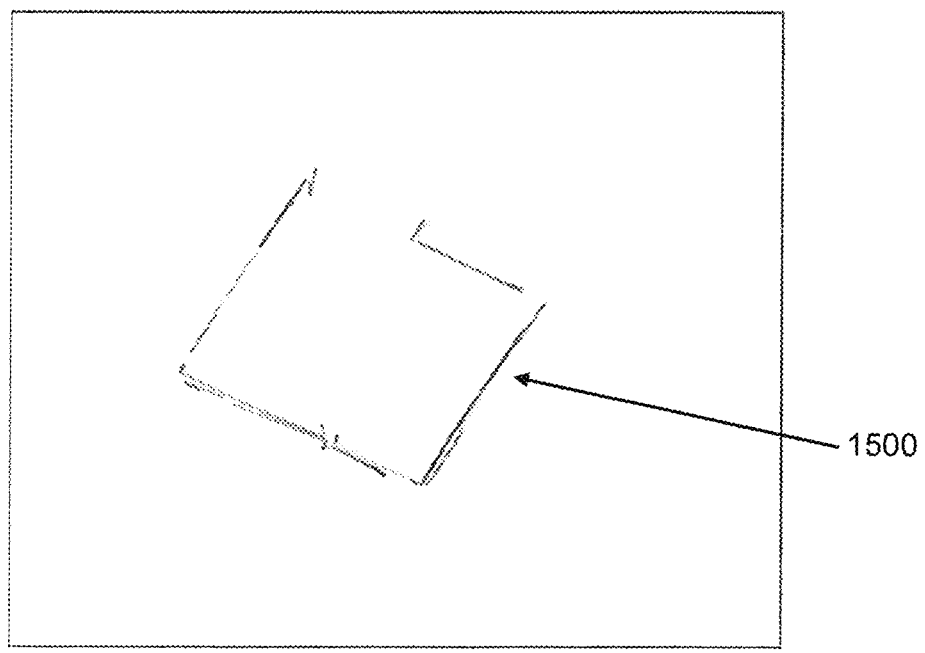
FIG. 15 illustrates contours of the outside border of the roof constructed using aerial imagery.

In some embodiments, when refining the 3D model, the outside border of the surfaces of the 3D model can be subdivided into a plurality of segments or arcs, and each of the segments or arcs can be adjusted individually. For example, when the outside border of the 3D model is projected onto the aerial imagery using the co-registration parameters, the outside border can be defined by a polygon composed of several edges. Each of the edges of the projected 3D model can be subdivided into smaller segments or arcs, with each of these segments being matched to a closest contour in the aerial imagery (for example such as contours 1500, shown in FIG. 15), for example using a nearest neighbour approach. The segments can subsequently be adjusted individually to correspond with their matched contour in the aerial imagery. As can be appreciated, a set of rules can be defined to establish how much and in what direction a polygon surface has to be moved. For example, neighboring surfaces can be moved together such that a closed border is maintained.

Figure 16:
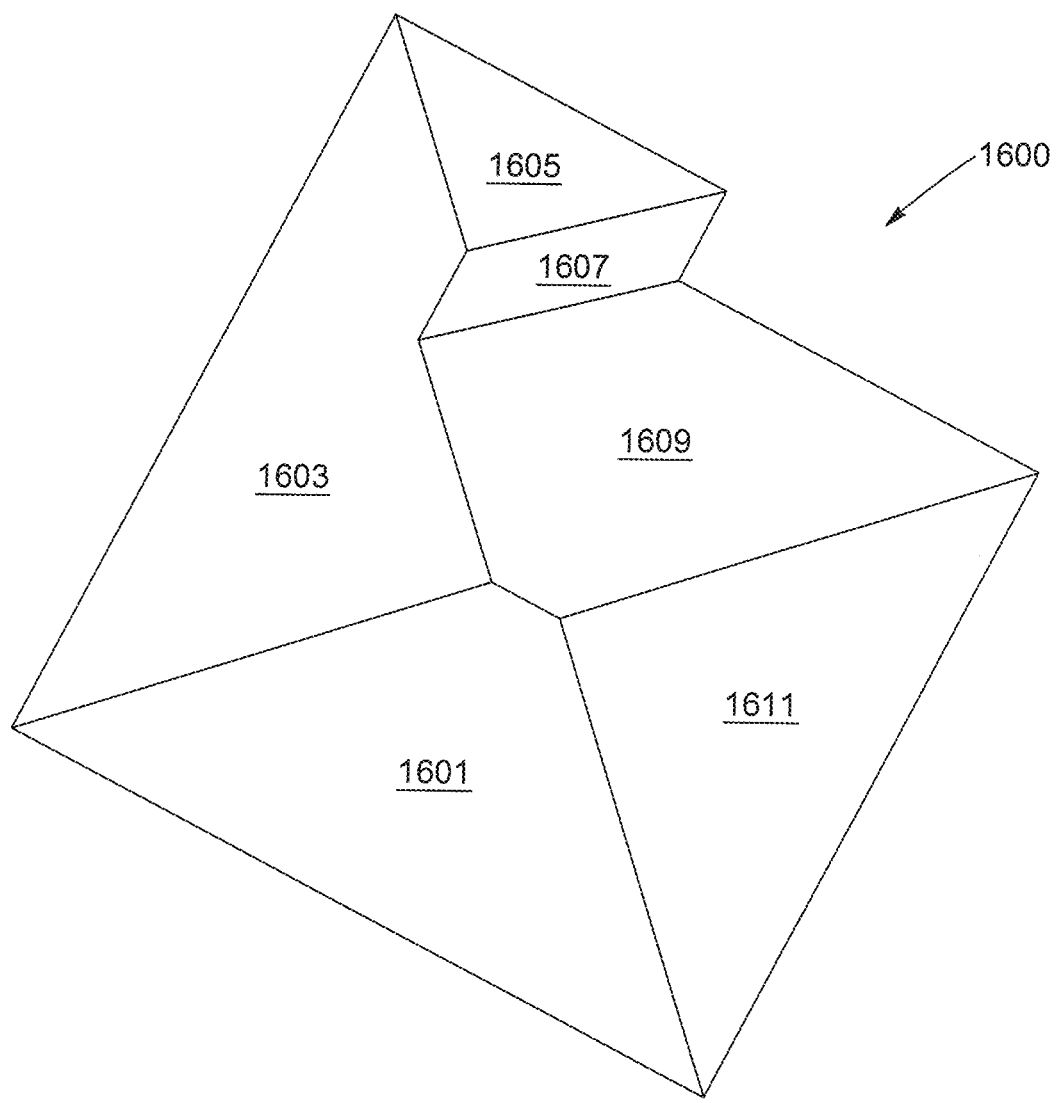
FIG. 16 illustrates an exemplary final refined 3D model of a roof.

In some embodiments, the refining of the 3D model discussed above can be carried out in an iterative fashion. For example, in each iteration, the borders of the 3D model can be adjusted to better match the contours by first calculating a set of rules for adjusting the polygons, as discussed above. The set of rules can then be applied to move the surfaces, and a quality score can be computed in order to quantify a level of conformity between the adjusted 3D model and the point cloud data. The quality score can be calculated, for example, by comparing the point cloud data to the 3D model, for example by calculating an average distance between the point cloud data points and the surfaces of the 3D model. The quality score can further be calculated based on characteristics of the 3D model, for example based on a geometrical complexity of the surfaces and a symmetry of the surfaces. At the end of each iteration, if the quality score is below a predetermined threshold, a subsequent iteration can be initiated. If the quality score is above a predetermined threshold, and/or if the outside edges can no longer be moved, the procedure can be stopped, and the model having the best quality score can be retained. An exemplary final refined 3D model 1600 is shown in FIG. 16, with exemplary roof surfaces 1601 thru 1611.

Although particular steps were described above for refining the 3D model and for co-registering the two sources of data, it is appreciated that further processing steps can be applied to assist in co-registration and/or to improve model refinement. In some embodiments, artificial intelligence algorithms, for example implemented via an artificial neural network, can be used to assist in carrying out several of the steps described above. For example, in some embodiments, the artificial neural network can be configured to identify different objects in the aerial imagery. In such embodiments, the neural network can be trained using images of buildings, of vegetation, and/or of any other geographical or environmental features. The training can be done from scratch, for example using available image data. Alternatively, a pre-existing training model can be used and/or refined as necessary. The neural network can be applied to process the aerial imagery in order to recognize and classify the trained objects. Recognizing objects can be used as landmarks to assist in co-registering the aerial imagery with the point cloud data. Recognizing objects can further assist in identifying and/or discarding outliers. For example, the neural network can recognize vegetation and/or environmental features in the aerial imagery, and point cloud data points at corresponding locations can be discarded. Similarly, the neural network can recognize buildings and/or roofs in the aerial imagery, and retain point cloud data points at corresponding locations.

Figure 22:
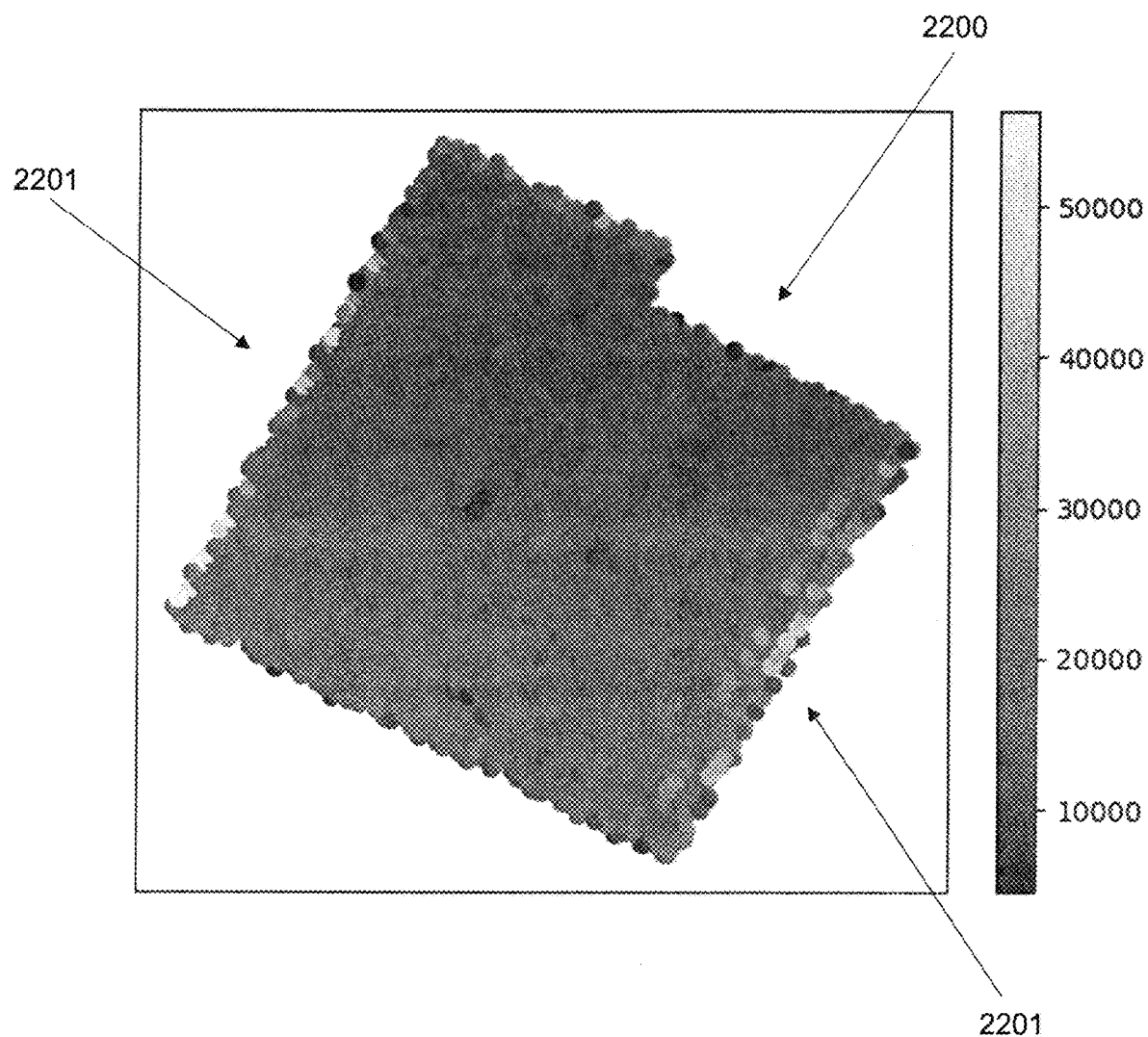
FIG. 22 illustrates LiDAR data of a roof of a building with corresponding intensity data.

In some embodiments, an intensity parameter of LiDAR data can be analyzed to detect and/or correlate a position of roof obstacles. For example, as shown in the exemplary LiDAR point cloud 2200 of FIG. 22, in addition to providing 3D position information, each LiDAR data point can also indicate an intensity of the pulse measured at its corresponding position. As can be appreciated, the intensity of a LiDAR data point at a given position can vary depending on the material at that position. More reflective materials or objects will result in a higher intensity measurement. Accordingly, reflectivity patterns in LiDAR data points can be recognized to infer the position of reflective roof elements, such as gutters, pipes, antennas, etc. In some embodiments, LiDAR data across a large geographical zone can be analyzed to define a statistical model of points corresponding to an obstacle. Such a statistical model can be, for example, a Gaussian mixture model or any other statistical model from which a likelihood value can be computed for each point's intensity. It is appreciated, that statistical models can be constructed on different scales.

As can be appreciated, the statistical model can be used to characterize each point to determine a likelihood of whether it corresponds to an obstacle. Points that are statistically close to an obstacle based on the model can be labelled accordingly. In some embodiments, intensity data can be correlated with other data, such as position, to better characterize obstacles. For example, points statistically close to the statistical description of an obstacle which are determined to be close to an exterior boundary of a point cloud can be labelled as corresponding to a gutter (for example, such as the light points in FIG. 22 in the regions denoted with reference numeral 2201). The position of a gutter can subsequently be inferred from the labelled points. It is appreciated that similar approaches can be used to detect and label different obstacles, for example based on their expected relative position on a roof surface. It is further appreciated that different statistical models can be generated to better identify different types of obstacles.

Analyzing LiDAR intensity data as described above can allow for obstacles to be detected prior to constructing a 3D model representing the roof surfaces. However, in some embodiments, obstacles can be detected using position and height information after the surfaces of the roof have been constructed and/or after points have been clustered. These approaches can be useful, for example, when intensity data is not available (for example if the point cloud data is not LiDAR data) and/or to correlate information inferred from intensity data.

In some embodiments, obstacles can be detected by analyzing height information of data points after constructing the 3D model of the surfaces of a roof. For example, a statistical description representing height differences across each surface in the 3D roof model can be calculated to identify points which deviate from the statistical description. Such points can be tagged as potential obstacles. As can be appreciated, a statistical description can be constructed in a similar fashion to identify potential obstacles using LiDAR intensity data, if available, and this can be correlated with points tagged using height data to confirm or discard those points as corresponding to obstacles.

Figure 17:
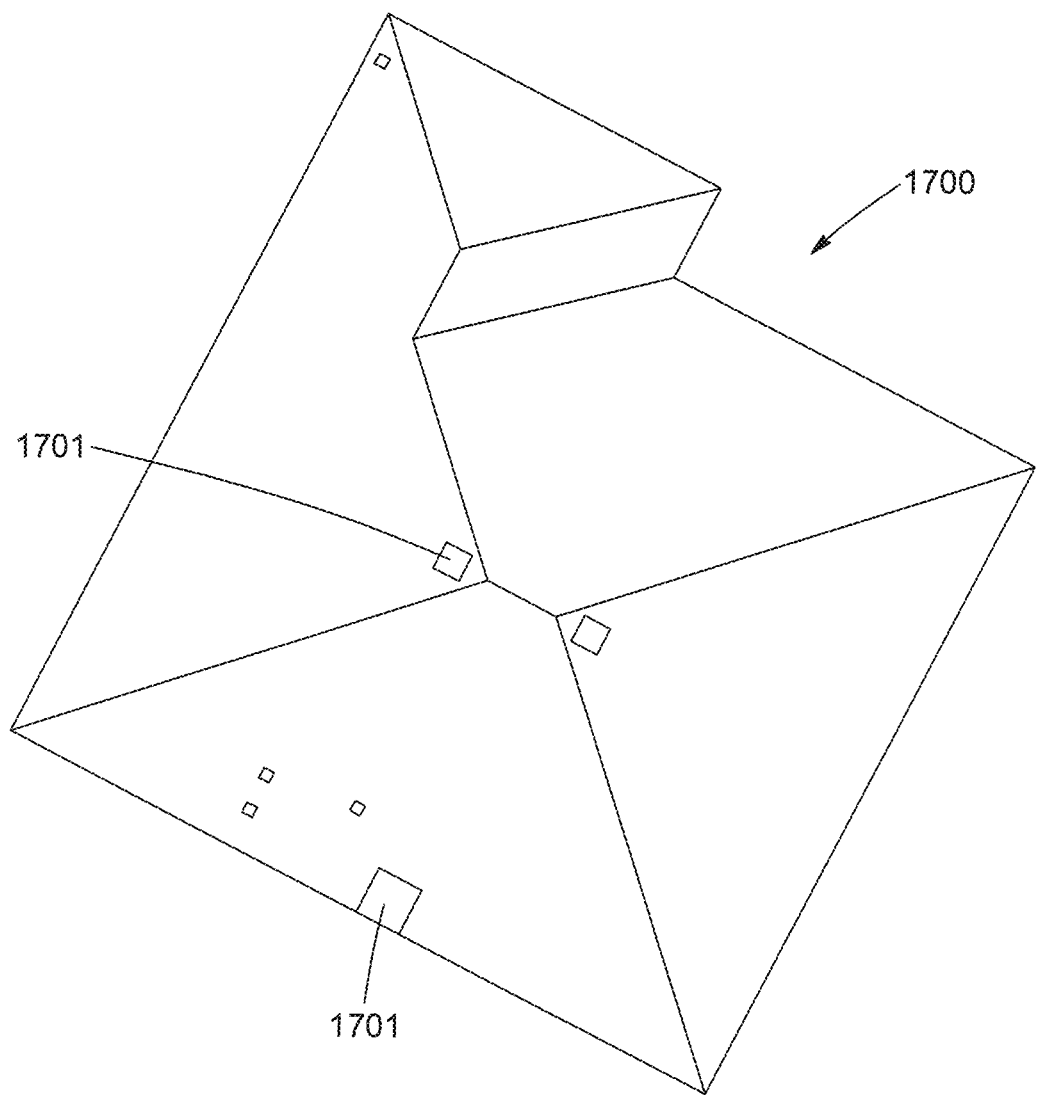
FIG. 17 is a 2D plan of the 3D model of FIG. 16, with visual indicators representing obstacles identified on the roof.

In some embodiments, obstacles can be detected by analyzing height information of data points after they have been clustered, but prior to reconstructing the roof surface. For example, a statistical description representing local height differences across each point cluster can be calculated to identify points which deviate from the statistical description. Such points can be tagged as potential obstacles. As can be appreciated, a statistical description can be constructed in a similar fashion to identify potential obstacles using LiDAR intensity data, if available, and this can be correlated with points tagged using height data to confirm or discard those points as corresponding to obstacles. In some embodiments, points tagged as obstacles in clusters can be projected onto the surface generated using the cluster to reduce a shadowing effect of the obstacle on the surface in subsequent steps of the processing pipeline. As shown in FIG. 17, such features and/obstacles 1701 can be added to the 3D model and/or can be flagged for subsequent analysis and/or for visual indication when the 3D model 1700 is displayed. Accordingly, an obstacle detection module can be provided for analyzing aerial data and detecting obstacles. In the described embodiment, obstacles are detected using height information from the LiDAR point cloud data, but it is appreciated that in other embodiments aerial imagery can be analyzed to identify features/obstacles and/or to correlate locations of obstacles detected using height information.

Once the 3D model has been refined, a subsequent operation 214 can include measuring the 3D model to obtain measurements of the roof. Operation 214 can be performed by one or more hardware processors configured by machine-readable instructions including a corresponding model in system 100. Although in the present embodiment the 3D model is measured after it is refined using aerial data, it is appreciated that in some embodiments the model generated using the point cloud data can be measured, for example in cases where refinement is not necessary.

Figure 18:
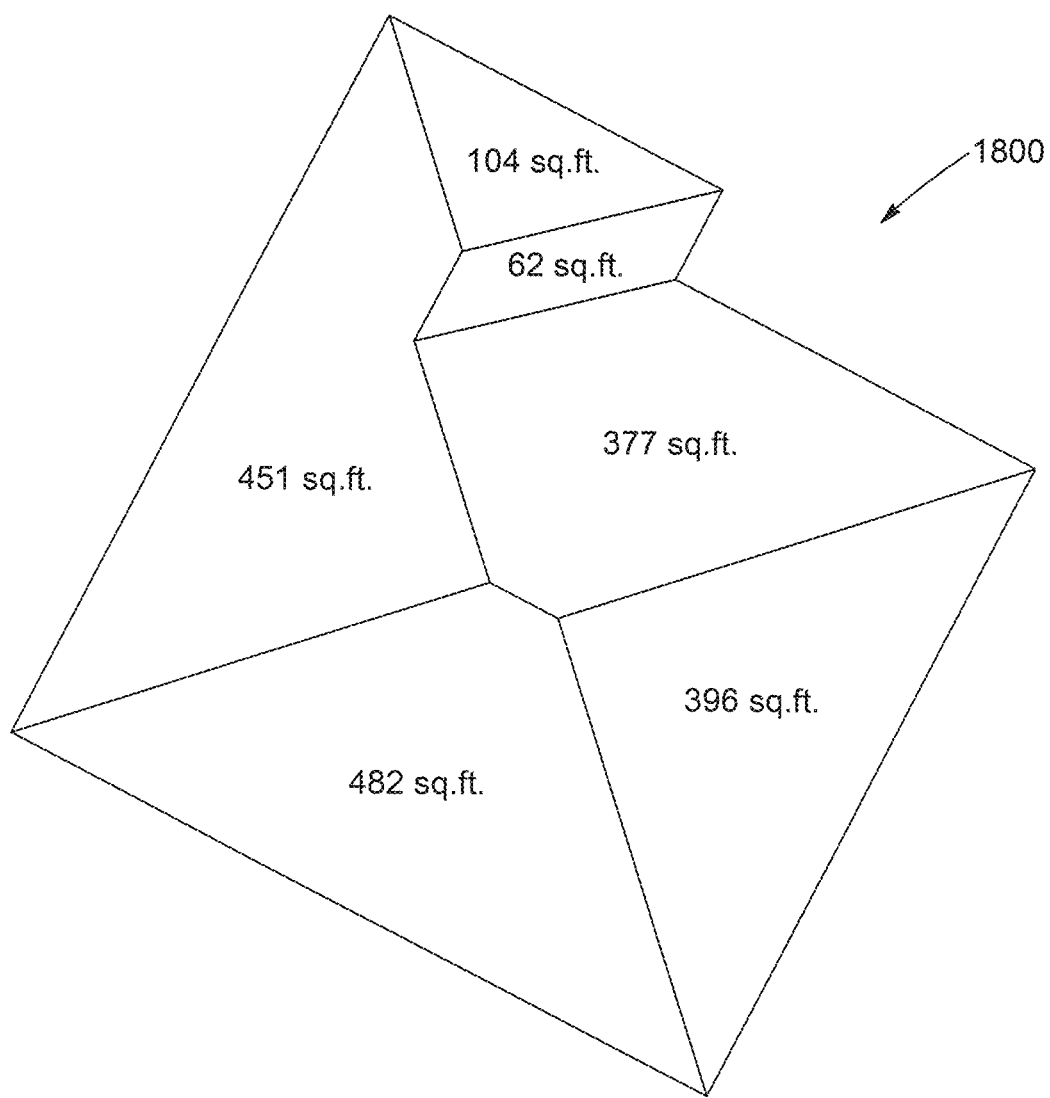
FIG. 18 is a 2D plan of the 3D model of FIG. 16, with visual indicators representing calculated area measurements of the roof surfaces.
Figure 19:
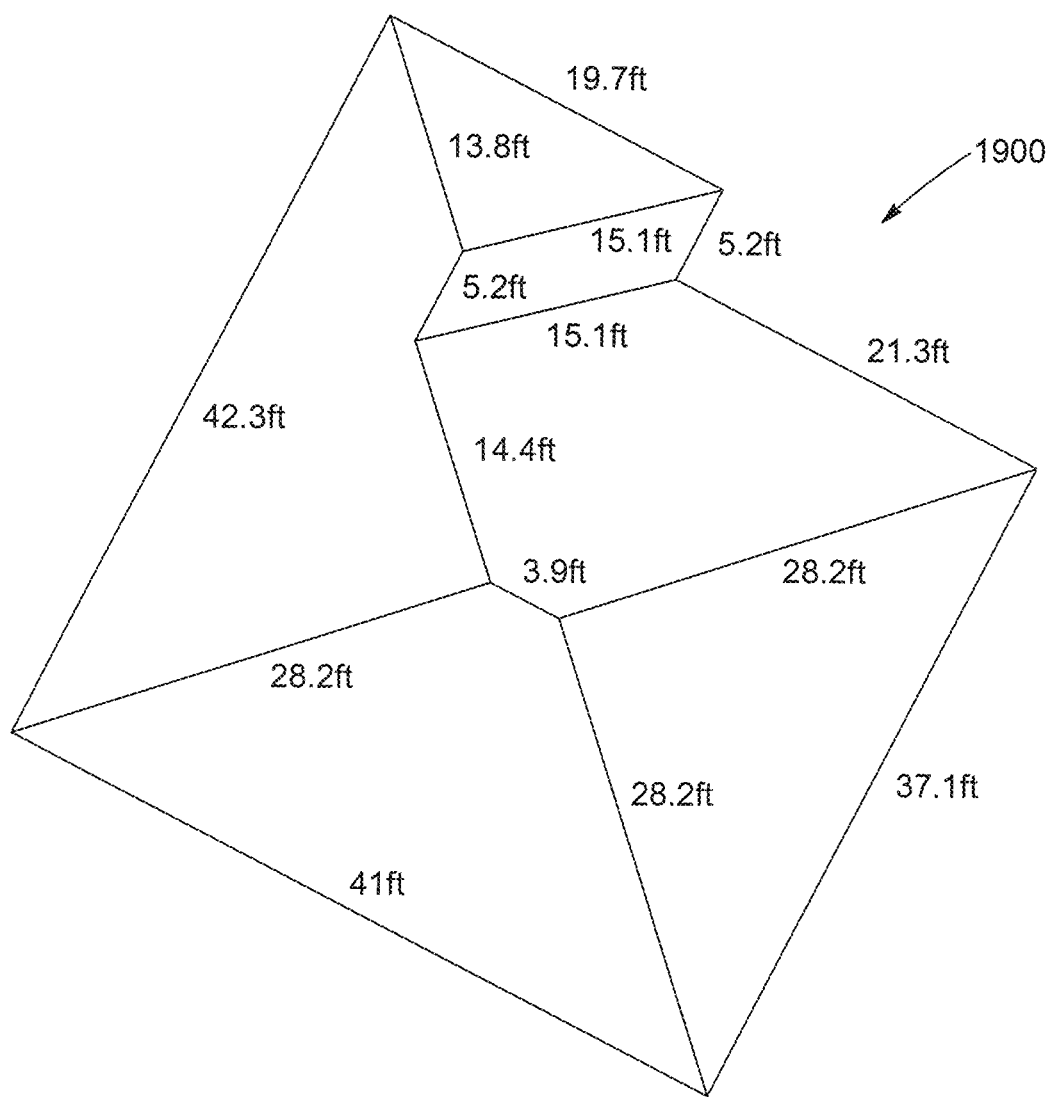
FIG. 19 is a 2D plan of the 3D model of FIG. 16, with visual indicators representing calculated length measurements of edges of the roof.

As can be appreciated, measuring the generated 3D model can serve to provide accurate measurements of the roof of the building which it represents. In an embodiment, a measuring module 120 can automatically measure certain parameters of the 3D model, including parameters of each of the individual roof surfaces and/or of the roof as a whole. For example, the measuring module 120 can be configured to calculate, for each roof surface, an area (for example as shown on the exemplary model rendering 1800 of FIG. 18), a slope, a curvature, a length of edges (for example as shown in the exemplary model rendering 1900 of FIG. 19), an angle of edges, a footprint area, a material, and a surface orientation. Similarly, the measuring module 120 can be configured to calculate, for the roof as a whole, an area, a perimeter, and a topology comprising surface connections. The measuring module 120 can further be configured to identify roof edge types such as ridges, hips, valleys, rakes, eaves, flashing, step flashing, and parapets. Finally, the measuring module 120 can further measure parameters of the building itself, including the approximate height and/or number of floors, and/or obstacles 1701 detected on the roof surfaces, for example as shown in FIG. 17.

A variety of different configurations are possible which allow the access and/or use of the generated 3D model and/or measurements taken therefrom. In an embodiment, for example as illustrated in FIG. 1B, the measuring system 100 can comprise an output module 130 for outputting and/or allowing access to the generated 3D model and/or measurements. For example, output module 130 can output the 3D model and/or measurements to a storage server 146 or database 148. In some embodiments, storage server 146 or database 148 can be provided locally on the measuring system 100, such as in a storage module thereon, while in other embodiments the storage server 146 and/or database 148 can be remote. For example, the storage module can comprise a database which can store data locally on the system, and/or a remote database for storing the data on remote storage. Preferably, the 3D model and/or measurements are accessible from the measurement system via an API. An external system, such as a workstation or other remote computing device 144, can request the 3D model and/or measurements via an API. If the requested data already exists in the database, the measurement system can access such and provide it to the remote computing device. If the data does not already exist, the measurement system can perform the necessary steps to generate the data, as described above, and provide it to the remote computing device. As can be appreciated, the manner in which the data is generated and/or accessed can be transparent to the remote computing device. As an example, if an external system needs measurements of a roof at a particular address or geographical location, it can send a request to the measuring system via an API which includes the address or geographical location. The measuring system can subsequently respond with all measurements of the roof at the provided location, and/or specifically requested measurements. In some embodiments, the external system can simply request the 3D model, and the measuring system can provide such 3D model, allowing the external system to perform measurements locally and/or render the 3D model, for example as shown in FIG. 16. Preferably, the 3D model can be exported in a variety of different formats, including .json, .obj, .fbx, .stl, .stlb, .dae, .3ds, .ply, .x, .stp, .igs, .dxf, .lwo, .bvh, .svg, .ac, .vrml, .x3d, etc.

Advantageously, the measuring system described above can form an integral part of a report generating system for generating detailed reports on roofs and buildings, for example for use in the fields of roof repair, solar panel installation and/or insurance. In embodiments, components of the measuring system can be implemented in the report generating system, or the report generating system can communicate with the measuring system via an API. In some embodiments, the report generating system receives the generated 3D model and/or measurements to generate a corresponding report, for example in the form of a webpage, document, proposal, quote, or other visual format, for example such as printed on paper. In some applications, the report can render the 3D model on a display of a processor-based device 144, for example as an interactive 3D model (zoomable, rotatable, etc., for example such as the rendering 1600 shown in FIG. 16), as a topological model, and/or as 2D views, such as a plan view (for example as shown in renderings 1700, 1800 and 1900 of FIGS. 17, 18 and 19).

In some embodiments, each roof surface in the rendered model can be uniquely identified, for example using references, legends and/or unique color coding. Similarly, visual indicia of roof obstacles can be rendered on the 2D or 3D views, for example via boxes 1701 as shown in FIG. 17. In some embodiments, different types of roof obstacles can be color coded according to their type. For example, by default, vents can be rendered in #2E7D32, pipes in #827717, chimneys in #FFEE58, skylights in #9E9E9E, antennas in #E0E0E0, etc., and such colors can be customized by users. Visual indicia can also be rendered on the 2D or 3D views to visually highlight identified roof features. Such features can also be uniquely color coded. For example, ridges can be rendered in #6A1B9A, hips in #BA68C8, valleys in #D81B60, rakes in #009688, eaves in #448AFF, flashing in #FF3D00, step flashing in #FF3D00, parapets in #607D8B, etc., and such colors can be customized by users.

The report can further overlay measurements directly on corresponding parts of the rendered model (as shown in the renderings 1700, 1800 and 1900 of FIGS. 17, 18 and 19) and/or display measurements separately in a table. In some embodiments, the report can be interactive, allowing a user to specify a surface and/or region to measure, and calculating/obtaining and displaying such measurement upon receiving a user's input. In some further embodiments, the report can automatically generate cost estimates using measurements, for example based on pricing and/or estimate data input by the user or received from a corresponding data source.

As can be appreciated, the measuring system and corresponding method described above is particularly advantageous because modelling and/or measuring roofs can be fully automated, and requires little to no human interaction. For example, by merely providing a location, the measuring system can generate a model and take any necessary measurements, and instantly generate a report therefrom. There is no need for user input to process the source data and/or refine the 3D model to have sufficiently accurate results. Such a configuration can allow a user to obtain a report on any roof/building on demand, provided point cloud data and aerial imagery are available in the corresponding area. Moreover, the present system can allow for data to be obtained much faster, as 3D models and measurements can be pre-generated prior to receiving a request from a user or a system via an API. Since no human interaction is required for modelling/measuring, data can be pre-generated for all roofs in a predefined region, for example in an entire region for which point cloud data and aerial imagery data has been received. In such embodiments, the operations 202 thru 214 described above (or any combination thereof) can be repeated for point cloud data in a predefined area, and 3D models and measurements can be generated for a plurality of buildings. The generated data can be subsequently stored in a database. When measurements or a 3D model of an address are requested from the system, the data will have already been generated, so the system need only access it from the database and provide it to the requesting system without needing to generate the data from scratch on-demand.

While the invention has been disclosed in conjunction with a description of certain embodiments, including those that are currently believed to be the preferred embodiments, the detailed description is intended to be illustrative and should not be understood to limit the scope of the present disclosure. As would be understood by one of ordinary skill in the art, embodiments other than those described in detail herein are encompassed by the present invention. Modifications and variations of the described embodiments may be made without departing from the spirit and scope of the invention.

It will further be understood that any of the ranges, values, properties, or characteristics given for any single component of the present disclosure can be used interchangeably with any ranges, values, properties, or characteristics given for any of the other components of the disclosure, where compatible, to form an embodiment having defined values for each of the components, as given herein throughout. Further, ranges provided for a genus or a category can also be applied to species within the genus or members of the category unless otherwise noted.

Finally, the qualifier "generally," and similar qualifiers as used in the present case, would be understood by one of ordinary skill in the art to accommodate recognizable attempts to conform a device to the qualified term, which may nevertheless fall short of doing so. This is because terms such as "sphere" are purely geometric constructs and no real-world component is a true "sphere" in the geometric sense. Variations from geometric and mathematical descriptions are unavoidable due to, among other things, manufacturing tolerances resulting in shape variations, defects and imperfections, non-uniform thermal expansion, and natural wear. Moreover, there exists for every object a level of magnification at which geometric and mathematical descriptors fail due to the nature of matter. One of ordinary skill would thus understand the term "generally" and relationships contemplated herein regardless of the inclusion of such qualifiers to include a range of variations from the literal geometric or mathematical meaning of the term in view of these and other considerations.

The invention claimed is:

1. A computer implemented method for automatically generating a 3D model of a roof of a building the method comprising;
   receiving point cloud data comprising a plurality of data points corresponding to height measurements at a given location;
   processing the point cloud data to identify roof surfaces;
   generating a 3D model of the roof using the identified surfaces;
   receiving aerial imagery of the roof;
   registering the aerial imagery with the point cloud data; and
   refining the generated 3D model using the aerial imagery;
   wherein generating the 3D model comprises computing a quality score for the generated 3D model, further wherein the following are only performed if the quality score is below a predetermined threshold: receiving aerial imagery of the roof: registering the aerial imagery with the point cloud data, and refining the generated 3D model using the aerial imagery.

2. The method according to claim 1, wherein the point cloud data comprises LiDAR data.

3. The method according to claim 1, wherein the quality score is calculated based on at least one of the following parameters: distances between data points in the point cloud data and the identified roof surfaces; distances between boundaries of the point cloud data and estimated exterior lines of the identified roof surfaces; and a total number of estimated lines and roof surfaces on the model of the roof in relation to a total area of the roof.

4. The method according to claim 1, wherein receiving point cloud data comprises receiving a user input corresponding to the approximate geographical location and requesting point cloud data at the approximate geographical location from a point cloud data source.

5. The method according to claim 1, wherein processing the point cloud data comprises clustering and/or segmenting the point cloud data to distinguish data points corresponding to the building from data points corresponding to neighboring buildings, vegetation, ground, or other objects.

6. The method according to claim 1, wherein processing the point cloud data comprises calculating local normals at the locations of each of the plurality of data points, further wherein points having normals within a predetermined threshold of one another are clustered into common planes corresponding to roof surfaces, points having nearly horizontal normals are tagged as wall points and/or points having a distance from the common planes greater than a predetermined threshold are tagged as outliers.

7. The method according to claim 1, wherein generating the 3D model comprises converting the point cloud data into the 3D model comprising a plurality of intersecting geometric shapes corresponding to the identified surfaces, and defining internal edges of the 3D model by:
   identifying intersections between the identified surfaces and end points of these intersections; or
   building a topology graph of the roof and using graph theory to connect the end points of internal lines to one another.

8. The method according to claim 1, wherein generating the 3D model comprises estimating external edges of the 3D model by interpolating a set of lines with respect to externalmost points of each outside roof surface and/or by optimizing the set of lines using local principal directions and end points of the internal lines as constraints.

9. The method according to claim 1, wherein registering the aerial imagery comprises projecting the point cloud data into a 2D referential corresponding to a 2D referential of the aerial imagery and generating therefrom a mask representing an approximate footprint of the roof.

10. The method according to claim 9, wherein projecting the point cloud data comprises receiving or estimating setting information of a camera having acquired the aerial imagery, and adjusting the point cloud data to compensate for said setting information.

11. The method according to claim 1, wherein registering the aerial imagery comprises at least one of: applying a contour detection algorithm to identify contours corresponding to roof boundaries; distinguishing between the roof and other surrounding objects using color-based similarities; and correlating edges of a binary mask of the roof with contours identified in the aerial imagery.

12. The method according to claim 1, wherein refining the 3D model comprises adjusting surfaces in the 3D model to conform with contours identified in the aerial imagery.

13. The method according to claim 12, therein edges of the surfaces in the 3D model are adjusted iteratively, further wherein during each iteration a set of one or more operations for moving an edge of the 3D model is determined and applied.

14. The method according to claim 13, wherein during each iteration, a quality score representing a level of conformity between the 3D model and the point cloud data is calculated, further wherein the iterations are repeated until the quality score reaches a predetermined threshold.

15. The method according to claim 14, wherein the quality score is calculated according to at least one of: an average distance of point cloud data points to the 3D model, a geometrical complexity of the surfaces, and a symmetry of the surfaces.

16. The method according to claim 1, further comprising identifying points in the point cloud data corresponding to roof obstacles: based on a statistical model of intensity data and/or height differences corresponding to potential roof obstacles.

17. The method according to claim 1, further comprising measuring the 3D model to obtain measurements of the roof and/or analyzing the 3D model to identity obstacle and/or roof features.

18. A non-transitory computer readable medium having instructions stored thereon which, when executed by a processor, cause the processor to:
receive point cloud data comprising a plurality of data points corresponding to height measurements at a given location;
process the point cloud data to identify roof surfaces;
generate a 3D model of the roof using the identified surfaces;
compute a quality score for the generated 3D model;
and perform the following only if the quality score is below a predetermined threshold:
receive aerial imagery of the roof;
register the aerial imagery with the point cloud data; and
refine the generated 3D model using the aerial imagery.

19. A computing system for automatically generating a 3D model of a roof of a building, the computing system comprising:
an input module configured to receive point cloud data comprising a plurality of data points corresponding to height measurements at a given location;
a processing module configured to:
process the point cloud data to identify roof surfaces;
generate a 3D model of the roof using the identified surfaces;
compute a quality score for the generated 3D model;
and perform the following only if the quality score is below a predetermined threshold:
receive aerial imagery of the roof via the input module;
register the aerial imagery with the point cloud data; and
refine the generated 3D model using the aerial imagery; and
an output module for transmitting, displaying and/or storing the refined 3D model.

* * * * *